US009082939B2

(12) United States Patent
Yamakawa et al.

(10) Patent No.: US 9,082,939 B2
(45) Date of Patent: Jul. 14, 2015

(54) WHITE LIGHT SOURCE AND WHITE LIGHT SOURCE SYSTEM INCLUDING THE SAME

(71) Applicants: KABUSHIKI KAISHA TOSHIBA, Tokyo (JP); TOSHIBA MATERIALS CO., LTD., Yokohama-shi, Kanagawa-ken (JP)

(72) Inventors: Masahiko Yamakawa, Yokohama (JP); Yasuhiro Shirakawa, Yokohama (JP)

(73) Assignees: KABUSHIKI KAISHA TOSHIBA, Tokyo (JP); TOSHIBA MATERIALS CO., LTD., Yokohama-shi (JP)

( * ) Notice: Subject to any disclaimer, the term of this patent is extended or adjusted under 35 U.S.C. 154(b) by 0 days.

(21) Appl. No.: 14/353,574

(22) PCT Filed: Oct. 23, 2012

(86) PCT No.: PCT/JP2012/077295
§ 371 (c)(1),
(2) Date: Apr. 23, 2014

(87) PCT Pub. No.: WO2013/061942
PCT Pub. Date: May 2, 2013

(65) Prior Publication Data
US 2014/0284636 A1    Sep. 25, 2014

(30) Foreign Application Priority Data

Oct. 24, 2011 (JP) .................................. 2011-233419
Oct. 24, 2011 (JP) .................................. 2011-233421

(51) Int. Cl.
*H01L 27/15* (2006.01)
*H01L 31/12* (2006.01)
*H01L 33/00* (2010.01)
*H01L 33/50* (2010.01)
*C09K 11/77* (2006.01)
*F21K 99/00* (2010.01)

(52) U.S. Cl.
CPC ............ *H01L 33/50* (2013.01); *C09K 11/7734* (2013.01); *C09K 11/7738* (2013.01); *H01L 33/504* (2013.01); *F21K 9/135* (2013.01); *Y02B 20/181* (2013.01)

(58) Field of Classification Search
CPC .................. H01L 21/02392; H01L 21/02461; H01L 21/02543; H01L 29/6603; H01L 51/5396; H01L 51/525
USPC ............. 257/79, 88, 288, 290, 292, 428, 444, 257/E21.006, E21.05, E21.053, E21.077, 257/E21.351, E21.352, E21.367, E21.368
See application file for complete search history.

(56) References Cited

U.S. PATENT DOCUMENTS

| | | | |
|---|---|---|---|
| 6,417,019 B1 | 7/2002 | Mueller et al. | |
| 7,611,641 B2 * | 11/2009 | Schmidt et al. | 257/98 |
| 7,646,032 B2 | 1/2010 | Radkov et al. | |
| 7,700,002 B2 * | 4/2010 | Schmidt et al. | 252/301.4 F |
| 7,906,790 B2 | 3/2011 | Radkov et al. | |
| 8,403,531 B2 * | 3/2013 | Negley et al. | 362/249.02 |
| 8,581,488 B2 | 11/2013 | Sakuta et al. | |
| 8,684,559 B2 * | 4/2014 | Van De Ven et al. | 362/293 |
| 2002/0158565 A1 | 10/2002 | Setlur et al. | |
| 2007/0235751 A1 | 10/2007 | Radkov et al. | |
| 2007/0276606 A1 | 11/2007 | Radkov et al. | |
| 2010/0063566 A1 | 3/2010 | Uchiumi et al. | |
| 2012/0112626 A1 | 5/2012 | Sakuta et al. | |
| 2014/0042896 A1 | 2/2014 | Sakuta et al. | |

FOREIGN PATENT DOCUMENTS

| | | |
|---|---|---|
| JP | 10-242513 A | 9/1998 |
| JP | 2003-034791 A | 2/2003 |
| JP | 2007-524726 A | 8/2007 |
| JP | 2007-250817 A | 9/2007 |
| JP | 2010-268004 A | 11/2010 |
| WO | WO 2008/069101 A1 | 6/2008 |
| WO | WO 2008/153120 A1 | 12/2008 |
| WO | WO 2011/024818 A1 | 3/2011 |

OTHER PUBLICATIONS

U.S. Appl. No. 14/353,579, filed Apr. 23, 2014, Kabushiki Kaisha Toshiba et al.

Translation of International Preliminary Report on Patentability corresponding to PCT/JP2012/077295, Oct. 23, 2012.

* cited by examiner

*Primary Examiner* — David Nhu
(74) *Attorney, Agent, or Firm* — Foley & Lardner LLP

(57) ABSTRACT

The present invention provides a white light source comprising: a light emitting diode (LED) having a light emission peak wavelength in a range of 350 or more and 420 nm or less; and a phosphor layer including four or more types of phosphors and resin, wherein the white light source satisfies a relational equation of: $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$, assuming that: a light emission spectrum of the white light source is $P(\lambda)$; a light emission spectrum of black-body radiation having a same color temperature as that of the white light source is $B(\lambda)$; a spectrum of a spectral luminous efficiency is $V(\lambda)$; a wavelength at which $P(\lambda) \times V(\lambda)$ becomes largest is $\lambda max1$; and a wavelength at which $B(\lambda) \times V(\lambda)$ becomes largest is $\lambda max2$, and wherein an amount (difference) of chromaticity change on CIE chromaticity diagram from a time of initial lighting up of the white light source to a time after the white light source is continuously lighted up for 6000 hours is less than 0.010. According to the above white light source, there can be provided a white light source capable of reproducing the same light emission spectrum as that of natural light.

12 Claims, 12 Drawing Sheets

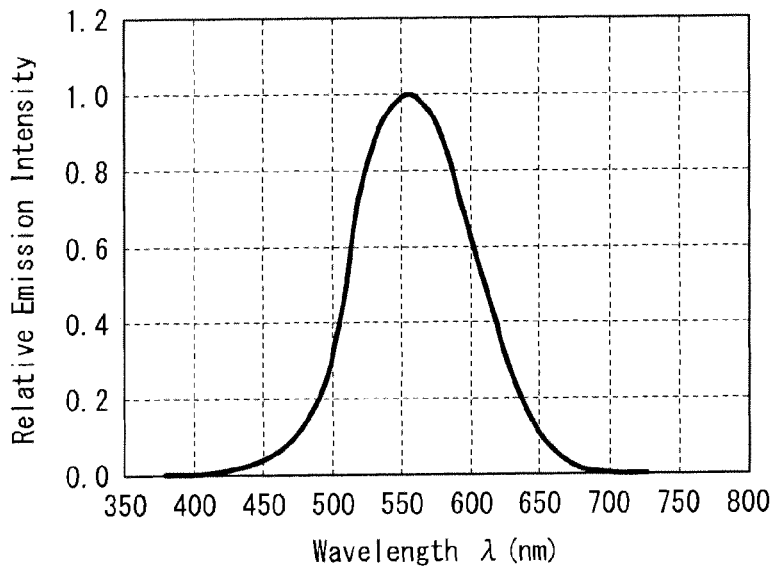
FIG. 1
$$B(\lambda) = \frac{2hc^2}{\lambda^5} \frac{1}{e^{hc/\lambda kT}-1}$$
FIG. 2
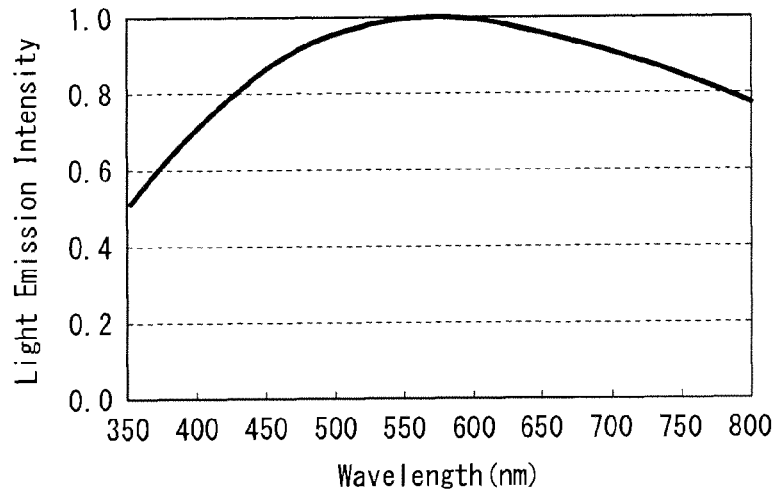
FIG. 3

WHITE LIGHT SOURCE AND WHITE LIGHT SOURCE SYSTEM INCLUDING THE SAME

This application is a U.S. National Stage of International Application PCT/JP2012/077295 filed on Oct. 23, 2012 and claiming priority to Japanese Application No. 2011-233421 filed on Oct. 24, 2011 and Japanese Application No. 2000-233419 filed on Oct. 24, 2011.

TECHNICAL FIELD

The present invention relates to a white light source and a white light source system including the white light source. More particularly, the present invention relates to a white light source having a light emission spectrum close to the light emission spectrum of natural light, and relates to a white light source system including the white light source.

BACKGROUND ART

In recent years, white light sources including light emitting diodes (LEDs) have attracted attention in terms of energy saving measures and a reduction in the amount of emitted carbon dioxide. As compared with conventional incandescent bulbs including tungsten filaments, LEDs have longer service life, and enable energy saving.

As disclosed in Japanese Patent Laid-Open (Unexamined Publication) No. 10-242513 (Patent Document 1), in conventional white LEDs, YAG phosphors are excited using blue LEDs each having a light emission peak wavelength in a range of 400 to 530 nm, and the blue light emitted from the LEDs and the yellow light emitted from the YAG phosphors are mixed with each other, whereby white light is achieved and realized.

White light sources including LEDs have been widely used as backlights of traffic signal lights and liquid crystal displays (LCD) as well as general lighting equipment (illuminating equipment) such as room lights. In the light emission spectra of conventional white light sources including blue LEDs, the peak height of the blue light emitted from the blue LEDs is as large as at least 1.5 times the peak height of the yellow light emitted from phosphors, and hence influences of the blue light tend to be strong.

Under the circumstances, with the popularization of the white light sources including LEDs, adverse effects of the white light sources on human bodies start to be worried about. As described above, the light emission peaks of blue LEDs are strong in conventional white LEDs. Such white light having a strong blue emission peak is significantly different from that of natural light. Here, the natural light refers to sunlight.

According to the pamphlet of International Publication No. WO 2008/069101 (Patent Document 2), which has been achieved in consideration of the influences of such white light sources on human bodies, LEDs and phosphors having different light emission peaks are combined, and four types of light emission peak are thus mixed, whereby a white light with a small deviation from the spectral luminous efficiency is provided.

Here, the sensitivity of a human eye to light is referred to as luminosity function, and the spectral luminous efficiency is defined as standard spectral luminosity function $V(\lambda)$ by International Commission on Illumination (CIE). Accordingly, the spectral luminous efficiency and the standard spectral luminosity function $V(\lambda)$ are the same in meaning. FIG. 1 shows the spectral luminous efficiency $V(\lambda)$ defined by CIE. That is, FIG. 1 shows that humans recognize light having a wavelength of about 555 nm at the highest sensitivity.

On the other hand, Patent Document 2 has an object to control light having a wavelength in a range of 420 to 490 nm, in consideration of influences of blue light on human bodies. Such a method can be expected to produce an effect of normalizing the secretion of melatonin that is one of hormones concerning adjustment by a biological clock in the nighttime.

In this regard, humans have a circadian rhythm (24-hour rhythm) controlled by an internal body clock. Humans are supposed to basically live under natural light, but there are a variety of lifestyles, such as long-time indoor work and a day-night reversal style, in modern society. If a life without exposure to natural light is continued for a long period, the circadian rhythm is disturbed, and adverse effects on human bodies are worried about.

PRIOR ART DOCUMENTS

Patent Document

Patent Document 1: Japanese Patent Laid-Open No. 10 (1998)-242513
Patent Document 2: the pamphlet of International Publication No. WO 2008/069101

DISCLOSURE OF THE INVENTION

Problems to be Solved by the Invention

Current white light sources including LEDs, that is, white light sources including blue LEDs have light emission spectra significantly different from that of natural light. A long-time life under irradiation by such white light sources may adversely affect a human circadian rhythm.

The present invention, which has been made in order to deal with such a problem, has an object to provide a white light source having a light emission spectrum close to the light emission spectrum of natural light.

Means for Solving the Problems

In order to achieve the above-mentioned object, a white light source according to a first invention comprises: a light emitting diode (LED) having a light emission peak wavelength in a range of 350 or more and 420 nm or less; and a phosphor layer including four or more types of phosphors and resin, wherein the white light source satisfies a relational equation of $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$, assuming that: a light emission spectrum of the white light source is $P(\lambda)$; a light emission spectrum of black-body radiation having a same color temperature as that of the white light source is $B(\lambda)$; a spectrum of a spectral luminous efficiency is $V(\lambda)$; a wavelength at which $P(\lambda) \times V(\lambda)$ becomes largest is $\lambda max1$; and a wavelength at which $B(\lambda) \times V(\lambda)$ becomes largest is $\lambda max2$, and wherein an amount (difference) of chromaticity change on CIE chromaticity diagram from a time of initial lighting up of the white light source to a time after the white light source is continuously lighted up for 6000 hours is less than 0.010.

Further, a white light source according to a second invention comprises: a light emitting diode (LED) having a light emission peak wavelength in a range of 350 nm or more and 420 nm or less and a phosphor layer including phosphor and resin, wherein the white light source satisfies a relational equation of $-0.2 \leq [(P(\lambda) \times V(\lambda))/(P(\lambda max1) \times V(\lambda max1)) - (B$ $(\lambda) \times V(\lambda))/(B(\lambda max2) \times V(\lambda max2))] \leq +0.2$, assuming that: a light emission spectrum of the white light source is $P(\lambda)$; a light emission spectrum of black-body radiation having a same color temperature as that of the white light source is $BR$); a spectrum of a spectral luminous efficiency is $V(\lambda)$; a wavelength at which $P(\lambda) \times V(\lambda)$ becomes largest is $\lambda max1$; and a wavelength at which $B(\lambda) \times V(\lambda)$ becomes largest is $\lambda max2$, and wherein a mass ratio of the phosphor contained in the phosphor layer is 5 mass % or more and 50 mass % or less.

It is more preferable that each of the above-mentioned white light sources satisfies a relational equation of $-0.1 \leq [(P(\lambda) \times V(\lambda))/(P(\lambda max1) \times V(\lambda max1)) - (B(\lambda) \times V(\lambda))/((\lambda max2) \times V(\lambda max2))] \leq +0.1$. Further, it is preferable that the color temperature of the white light source is set to be 2,500 to 7,000 K.

Further, in the white light source of the first invention, it is preferable that the four or more types of phosphor each having different peak wavelengths are used in a combination so as to cause a mutual absorption in which one phosphor is excited by absorbing a light emitted from another phosphor.

Furthermore, in the white light source of the second invention, it is preferable that the phosphor layer comprises four or more types of phosphors having different peak wavelengths.

Further, the four or more types of phosphor each having different peak wavelengths are used in a combination so as to cause a mutual absorption in which one phosphor is excited by absorbing a light emitted from another phosphor. Furthermore, in the white light sources of the first and second invention, it is preferable that the phosphor layer has a thickness of 0.1 mm or more and 3 mm or less. In addition, it is preferable that the phosphor contained in the phosphor layer has an average particle diameter of 1 μm or more and 80 μm or less.

Further, it is more preferable that a space is formed to a portion between the phosphor layer and the light emitting diode. Further, it is also preferable that the phosphor layer is provided on the light emitting diode. Further, it is also preferable that the phosphor layer is provided on the light emitting diode through a transparent resin layer.

Further, a white light source system according to the present invention is configured by comprising a plurality of the above-mentioned white light sources according to the present invention.

Advantages of the Invention

A white light source according to the present invention can reproduce the same light emission spectrum as that of natural light. Accordingly, even if a human body is exposed to white light emitted from the white light source for a long time, adverse effects on the human body can be made equivalent to those of natural light.

Further, since four or more types of phosphor each having different peak wavelengths are used, there can be provided a white light source capable of suppressing a chromaticity change even after the white light source is used for a long period of time, thus having a high reliability.

Further, in a case where the mass ratio of the phosphor contained in the phosphor layer is controlled, there can be provided a white light source capable of effectively suppressing a brightness degradation, and having a high reliability.

BRIEF DESCRIPTION OF THE DRAWINGS

FIG. 1 is a graph showing a spectral luminous efficiency $V(\lambda)$.

FIG. 2 is a mathematical expression (formula) for obtaining a light emission spectrum $B(\lambda)$ of black-body radiation.

FIG. 3 is a graph showing an example of the light emission spectrum of a natural light in day time.

BEST MODE FOR CARRYING OUT THE INVENTION

A white light source according to an embodiment of the present invention comprises a blue light emitting diode (blue LED) having a light emission peak wavelength in a range of 421 to 490 nm, and satisfies a relational equation of $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$, assuming that: the light emission spectrum of the white light source is $P(\lambda)$; the light emission spectrum of black-body radiation having the same color temperature as that of the white light source is $B(\lambda)$; the spectrum of a spectral luminous efficiency is $V(\lambda)$; the wavelength at which $P(\lambda) \times V(\lambda)$ becomes largest is $\lambda max1$; and the wavelength at which $B(\lambda) \times V(\lambda)$ becomes largest is $\lambda\max2$. Here, $\lambda$ denotes a wavelength of 380 to 780 nm in a visible light region.

The white light source satisfying the above-mentioned relational equation is configured according to the following procedures. First, the light emission spectrum $P(\lambda)$ of the white light source is measured. The light emission spectrum is measured according to total luminous flux measurement using an integrating sphere in conformity with JIS-C-8152. The color temperature is calculated from the light emission spectrum. Note that the unit of the color temperature is kelvin (K).

Next, the light emission spectrum $B(\lambda)$ of the black-body radiation having the same color temperature as that of the white light source is obtained. The light emission spectrum $B(\lambda)$ is obtained according to Planck's distribution. The Planck's distribution can be obtained according to a mathematical expression shown in FIG. 2. In FIG. 2, $\lambda$ denotes a Planck's constant, c denotes the speed of light, denotes a wavelength, e denotes a base of natural logarithm, k denotes a Boltzmann's constant, and T denotes a color temperature. Because h, c, e, and k are constants, if the color temperature T is determined, the light emission spectrum of the black-body radiation can be obtained in accordance with the wavelength $\lambda$.

Figure 4:
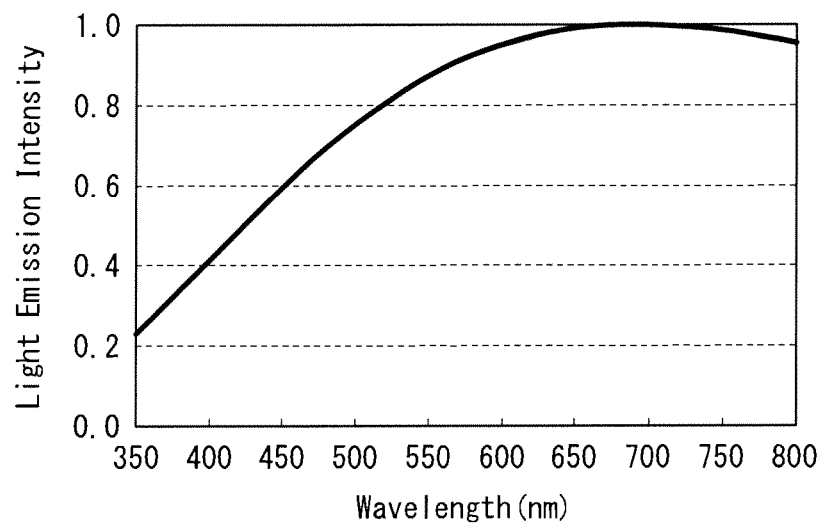
FIG. 4 is a graph showing an example of the light emission spectrum of a natural light in the morning
Figure 5:
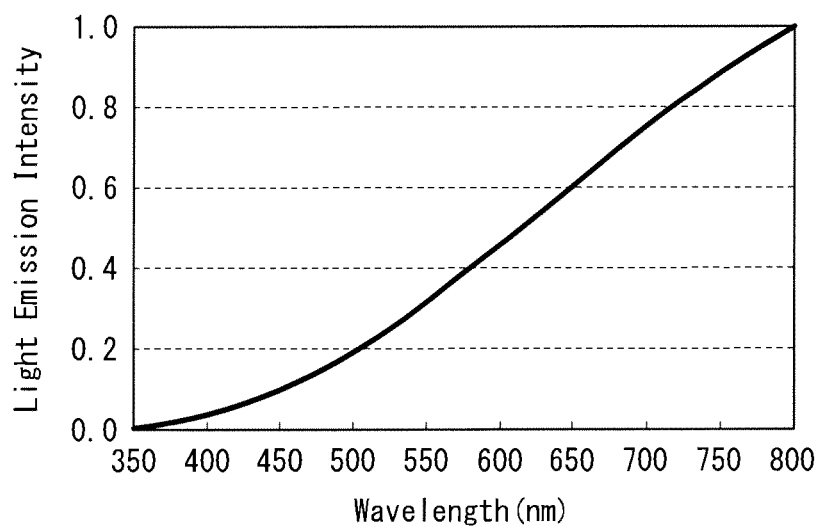
FIG. 5 is a graph showing an example of the light emission spectrum of a natural light at sunrise.

In the present invention, the black-body radiation indicates the light emission spectrum of natural light (sunlight). The natural light has different color temperatures, for example, in the daytime, in the morning, at sunrise, and in the evening. More specifically, FIG. 3 shows an example of a light emission spectrum of the natural light in the daytime (the color temperature is about 5100 K), FIG. 4 shows an example of a light emission spectrum of the natural light in the morning (the color temperature is about 4200 K), and FIG. 5 shows an example of a light emission spectrum of the natural light at sunrise (the color temperature is about 2700 K), respectively. Note that 7 a.m. is assumed as the morning in FIG. 4.

Figure 6:
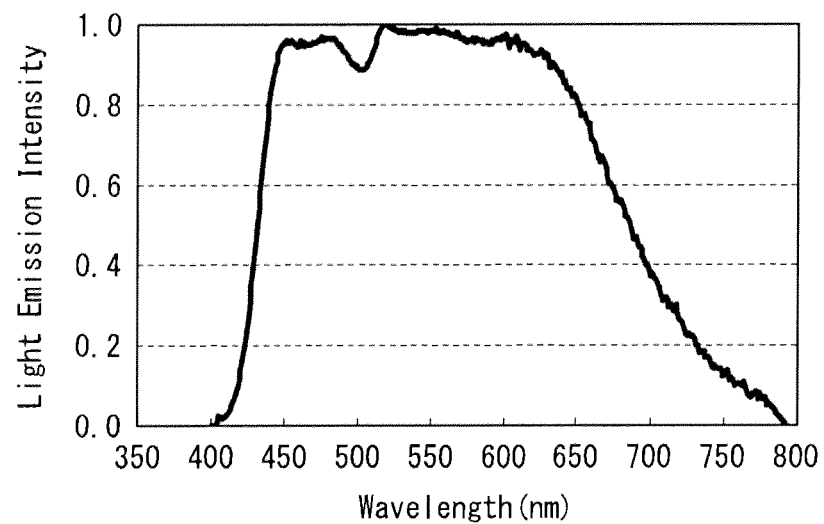
FIG. 6 is a graph showing the light emission spectrum of white light source in Example 1.
Figure 7:
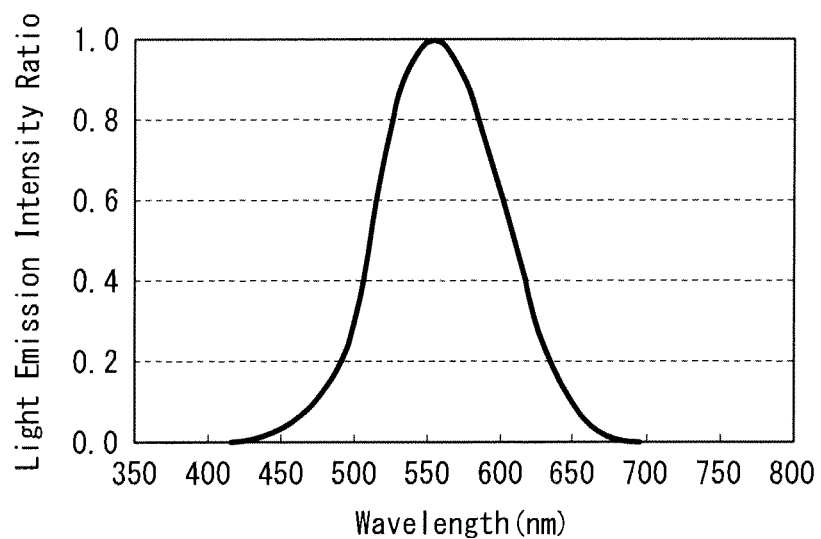
FIG. 7 is a graph showing $(P(\lambda) \times V(\lambda))/(P(\lambda max1) \times V(\lambda max1))$ in Example 1.

FIG. 6 shows a light emission spectrum $P(\lambda)$ in Example 1 to be described later. FIG. 7 shows $(P(\lambda) \times V(\lambda))/(P(\lambda\max1) \times V(\lambda\max1))$ in Example 1. Further, FIG. 8 shows $(B(\lambda) \times V(\lambda))/(B(\lambda\max2) \times V(\lambda\max2))$, assuming that the light emission spectrum of natural light in daytime (FIG. 3) is $B(\lambda)$.

Figure 8:
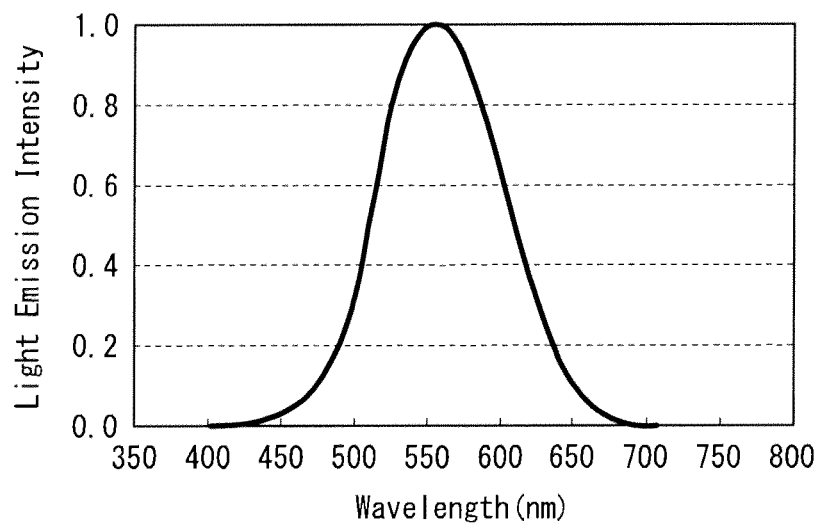
FIG. 8 is a graph showing $(B(\lambda) \times V(\lambda))/(B(\lambda max2) \times V(\lambda max2))$, assuming that a black-body radiation having the same color temperature as in FIG. 3 is $B(\lambda)$.

The spectral luminous efficiency shown in FIG. 1 is used for $V(\lambda)$ for obtaining FIG. 7 and FIG. 8.

FIG. 7 is a graph obtained by: multiplying, for each wavelength, values of the light emission spectrum $P(\lambda)$ in Example 1 shown in FIG. 6 by values of the spectral luminous efficiency $V(\lambda)$; dividing the resultant products by $(P(\lambda\max1) \times V(\lambda\max1))$; and plotting the resultant quotients. In FIG. 7, the wavelength at which $(P(\lambda) \times V(\lambda))$ becomes largest is $\lambda\max1=556$ nm.

FIG. 8 is a graph obtained by: multiplying, for each wavelength, values of the light emission spectrum $B(\lambda)$ in FIG. 3 by values of the spectral luminous efficiency $V(\lambda)$; dividing the resultant products by $(B(\lambda\max2) \times V(\lambda\max2))$; and plotting the resultant quotients. In FIG. 8, the wavelength at which $(B(\lambda) \times V(\lambda))$ becomes largest is $\lambda\max2=556$ nm.

$(P(\lambda) \times V(\lambda))$ indicates the intensity of the light emission spectrum of the white light source in a spectral luminous efficiency $V(\lambda)$ region. $(P(\lambda) \times V(\lambda))$ is divided by $(P(\lambda\max1) \times V(\lambda\max1))$ that is the maximum value, whereby the upper limit thereof can be 1.0 as shown in FIG. 7.

Further, $(B(\lambda) \times V(\lambda))$ indicates the intensity of the light emission spectrum of the black-body radiation in the spectral luminous efficiency $V(\lambda)$ region. $(B(\lambda) \times V(\lambda))$ is divided by $(B(\lambda\max2) \times V(\lambda\max2))$ that is the maximum value, whereby the upper limit thereof can be 1.0 as shown in FIG. 8.

Next, a difference $A(\lambda)=[(P(\lambda) \times V(\lambda))/(P(\lambda\max1) \times V(\lambda\max1))-(B(\lambda) \times V(\lambda))/(B(\lambda\max2) \times V(\lambda\max2))]$ is obtained. The white light source according to the present embodiment satisfies a relation: $-0.2 \leq [(P(\lambda) \times V(\lambda))/(P(\lambda\max1) \times V(\lambda\max1))-(B(\lambda) \times V(\lambda))/(B(\lambda\max2) \times V(\lambda\max2))] \leq +0.2$. If the difference $A(\lambda)$ satisfies the relation: $-0.2 \leq A(\lambda) \leq +0.2$, the light emission spectrum of the white light source in the spectral luminous efficiency $V(\lambda)$ region is close to the light emission spectrum of the black-body radiation, in other words, the light emission spectrum of the natural light. That is, if the difference $A(\lambda)$ is zero ($A(\lambda)=0$), the same light emission spectrum as that of the natural light can be reproduced.

Figure 9:
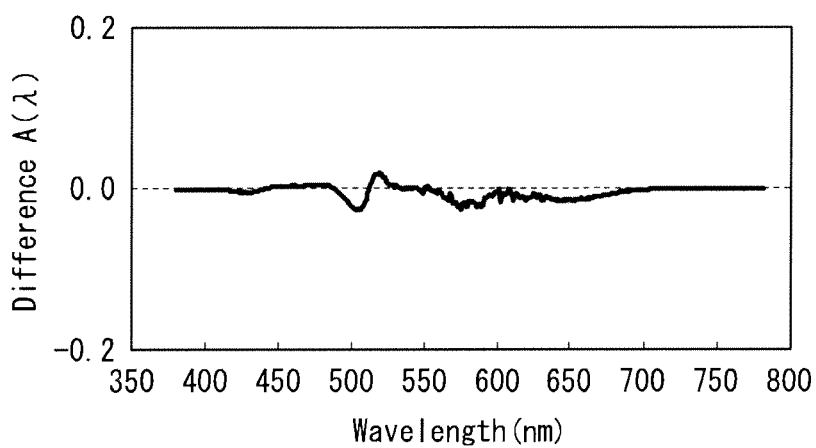
FIG. 9 is a graph showing a difference $A(\lambda)$ in Example 1.

FIG. 9 shows the difference $A(\lambda)$ in Example 1. As is apparent from FIG. 9, in Example 1, the range of the difference $A(\lambda)$ is $-0.03 \leq A(\lambda) \leq +0.02$, and it can be confirmed that the natural light in the daytime is reproduced in Example 1.

As described above, according to the present embodiment, the light emission spectrum is designed to be close to the light emission spectrum of the black-body radiation. Hence, as compared with conventional white LEDs having blue light peaks that stand out to be outstanding, the present embodiment can considerably suppress the adverse effects on a human circadian rhythm.

As described later in examples, the natural light at sunrise and the natural light in the morning can be also reproduced, and hence the light emission spectrum may be controlled so as to suit an intended use.

Further, if white light sources that can reproduce the natural light in the daytime, the natural light at sunrise, and the natural light in the morning are combined, the same natural light as one-day sunlight can be reproduced. For example, if such combined white light sources are used as lighting equipment in a hospital ward and in a place or room used for long-time indoor work, adverse effects on the circadian rhythms of patients who live therein and staffs who work therein can be suppressed. Further, because the natural light can be reproduced, application to agricultural fields such as plant cultivation using the natural light is also possible.

The white light source of the present invention comprises: a light emitting diode (LED) having a light emission peak wavelength in a range of 350 or more and 420 nm or less; and a phosphor layer including four or more types of phosphors and resin. Further, it is preferable that a peak wavelength of the phosphor falls within a range of 420 to 700 nm when the phosphor is excited by a light emitted from the light emitting diode having the light emission peak wavelength in a range of 350 or more and 420 nm or less.

Further, the white light source of the present invention is characterized in that an amount of chromaticity change on CIE chromaticity diagram from a time of initial lighting up of the white light source to a time after the white light source is continuously lighted up for 6000 hours is less than 0.010.

A method of measuring the amount of chromaticity change is performed as follows in accordance with JIS-Z-8518. Namely, chromaticity coordinate u', v' of a light emitted from the white light source are respectively measured at a time of initial lighting up of the white light source and at a time after the white light source is continuously lighted up for 6000 hours. Then, differences $\Delta u'$, $\Delta v'$ that are indicated as differences in chromaticity coordinate on the CIE chromaticity diagram are obtained. The amount of chromaticity change is obtained from the following calculation formula:

$$\text{Amount of chromaticity change}=[(\Delta u')^2+(\Delta v')^2]^{1/2}.$$

In the white light source of the first invention, the amount of chromaticity change can be reduced to be less than 0.010, further, less than 0.0085. The amount of chromaticity change of less than 0.010 indicates a state where the chromaticity change is hardly occurred even if the white light source is used for a long period of time from the time of initial lighting up of the white light source. Therefore, the white light source of the present invention can reproduce sunlight for a long period of time.

Further, the white light source of the first invention has a phosphor layer comprising: four or more types, preferably five or more types of phosphors having different peak wavelengths; and resin.

Further, it is preferable to use four or more types, more preferably five or more types of phosphor having different peak wavelengths. Further, adjacent peak wavelengths of the phosphors are different (are deviated to each other) by preferably 150 nm or less, more preferably 10 to 100 nm, and still more preferably 10 to 50 nm. That is, from a blue region to a red region, the peak wavelengths different every 10 to 100 nm are combined with the use of four or more types (more preferably five or more types) of phosphor, whereby $-0.2 \leq$ the difference $A(\lambda) \leq +0.2$ can be effectively achieved.

Further, it is preferable that the four or more types of phosphors are used in combination to cause a mutual light-absorption. In the white light source of the present invention, the phosphor is excited by using the light emitting diode having a peak wavelength of 350 nm or more and 420 nm or less. The phosphors used in combination to cause a mutual light-absorption means that one phosphor is excited by not only a light emitted from the light emitting diode but also a light emitted from another phosphor excited by the light emitted from the light emitting diode. Namely, the white light source comprises a phosphor which is excited by both the light emitted from the light emitting diode and the light emitted from another phosphor.

Further, when the four or more types of phosphors having different peak wavelengths are used, the respective phosphors emit lights in accordance with a light emitted from the light emitting diode. The light emission spectrum of the phosphor has an appropriate half band width. Therefore, when the types of phosphor to be mixed are increased, there is caused an over lap of the light emission spectra. At the same time, the light emitting wavelength region of the respective phosphors is over lapped with a light absorbing band of another phosphor.

More specifically, in a case where a blue phosphor, yellow phosphor, green phosphor, red phosphor are mixed, the emission light emitted from the blue phosphor excited by a light emitted from the light emitting diode is absorbed by the green, yellow and the red phosphor whereby the green, yellow phosphor and the red phosphor emit lights. At this time, the green phosphor is excited by two types of exciting sources comprising the light emitted the light emitting diode and the light emitted from the blue phosphor.

The same phenomenon occurs among the various color light emitting phosphors. Namely, the light emitted from the green phosphor is absorbed by the red phosphor thereby to emit red emission light, and the light emitted from the yellow phosphor is absorbed by the red phosphor thereby to emit a red emission light. As to the red phosphor, the red phosphor has four types of exciting sources comprising the light emitted from the light emitting diode, the light emitted from the blue phosphor, the light emitted from the green phosphor and the light emitted from the yellow phosphor.

As described above, when the phosphor layer comprising the phosphor which is excited by not only the light emitted from the light emitting diode but also the light emitted from another phosphor, there can be provided a white light source in which durability to deterioration with age is high and brightness degradation is suppressed. In this connection, whether the mutually light-absorbing property exists or not among the phosphors can be easily proved by investigating excitation spectra of the respective phosphors.

The white light source of the second invention comprises: a LED having a light emission peak wavelength in a range of 350 or more and 420 nm or less; and a phosphor layer including phosphor and resin. Further, it is preferable that a peak wavelength of the phosphor falls within a range of 420 to 700 nm when the phosphor is excited by a light emitted from the light emitting diode having the light emission peak wavelength in a range of 350 or more and 420 nm or less.

Furthermore, the second invention is characterized in that a mass ratio of the phosphor included in the phosphor layer is 60 mass % or more and 90 mass % or less. When the mass ratio of the phosphor contained in the phosphor layer is less than 60 mass %, an existing ratio of the phosphor is small, so that a scattering in brightness as a whole phosphor layer is liable to occur.

Further, when the light emitted from the light emitting diode passes through the phosphor layer, it becomes difficult to control the difference $A(\lambda)$ within an aimed range. Further, when the existing ratio of the phosphor in the phosphor layer becomes excessively small, an amount of the light emitted from the light emitting diode (peak wavelength: 350-420 nm) and irradiated to one phosphor particle is relatively increased to be excessive, so that an exciting density is increased to be high. When the exciting density is excessively increased to be high, there may be a fear that the high exciting density causes a defect-formation in the phosphor.

Further, when the mass ratio of the phosphor is set to 60 mass % or more, a brightness degradation can be prevented even if the white light source is used for a long period of time. When the existing ratio (mass ratio) of the phosphor contained in the phosphor layer is increased and a light emitting region of the phosphor is also increased, it becomes possible to suppress a lowering of the brightness. The existing ratio (mass ratio) of the phosphor contained in the phosphor layer is preferably set within a range of 70 to 85 mass %.

In order to suppress the lowering of the brightness, the mass ratio of the phosphor preferably be 100 mass %. However, in order to improve a structural strength of the phosphor layer, it is rather preferable that a resin region may exist in the phosphor layer. Therefore, an upper limit of the mass ratio of the phosphor is 90 mass %.

Further, in the second invention, when the types of phosphors having different peak wavelengths are increased to be three or more, preferably four or more, still preferably five or more, the lowering of brightness can be effectively suppressed even if the white light source is used for a long period of time.

As a method of measuring the mass ratio of the phosphor, there is a method in which the mass ratio is measured from a mixing ratio of phosphor powder to be used for forming the phosphor layer and the resin. In this case of the method, the mass ratio (%) of the phosphor contained in the phosphor layer is obtained from the following calculation formula:

Mass ratio of phosphor contained in phosphor layer= [phosphor weight to be mixed/(phosphor weight to be mixed+resin weight to be mixed)]×100(%)

Further, in a case where the mass ratio of the phosphor is measured from a completed phosphor layer, a predetermined amount of phosphor layer is cut out, and the weight of the cut out sample is measured. Thereafter, the resin component is removed, and the weight of the phosphor is measured. As a result, the mass ratio of the phosphor can be effectively measured from the following calculation formula:

Mass ratio of phosphor contained in phosphor layer=
[phosphor weight/weight of the cut out sample]×
100(%)

In the above measuring method, as a method of removing the resin component, there can be preferably used a method in which the resin component is burned and eliminated in atmosphere and a temperature without causing any oxidation of the phosphor. As the resin constituting the phosphor layer, thermo-hardening (setting) resin such as silicone resin or the like are used, so that the mass ratio can be measured by aforementioned method.

Further, when the phosphor is not uniformly mixed in the phosphor layer, such non-uniformity will cause a scattering in brightness. Therefore, there is no problem even if the mass ratio of phosphor contained in the phosphor layer, which is measured on the basis of the partially cut out sample, is regarded as the mass ratio represented by an entire phosphor layer.

Further, as described later, in a case where a transparent resin layer is disposed between the phosphor layer and the light emitting diode, this transparent resin layer is not included in the phosphor layer. Furthermore, in case of the globe type white light source, there may be a case where an adhesive layer is provided to a portion between the globe and the phosphor layer. However, the adhesive layer in this case is not included in the phosphor layer. In the present invention, it is important to control the mass ratio of the phosphor in the phosphor layer formed by mixing the phosphor and the resin Further, it is also preferable that the phosphor layer has a thickness of 0.1 to 3 mm. When the thickness of the phosphor layer is thin to be less than 0.1 mm, there may be a fear that the emission light emitted from the light emitting diode goes through the phosphor layer and leak outside. When the emission light emitted from the light emitting diode goes through the phosphor layer, it becomes difficult to control the difference $A(\lambda)$ of the white light source to fall within a range of $-0.2 \leq A(\lambda) \leq +0.2$.

On the other hand, when the thickness of the phosphor layer is thick to exceed 3 mm, it becomes difficult for the light emitted from the light emitting diode to spread over an entire phosphor layer in a thickness direction thereof. As a result, it becomes rather difficult to control the difference $A(\lambda)$ of the white light source to fall within a range of $-0.2 \leq A(\lambda) \leq +0.2$.

Furthermore, there may be a fear that the effect of the mutual light-absorption by the light emitted from phosphors cannot be sufficiently obtained. The thickness of the phosphor layer is more preferably set to within a range of 0.2 to 1.0 mm.

Further, it is preferable that the average particle diameter of the phosphor contained in the phosphor layer is set to be 1 μm or more and 100 μm or less, more preferably set to be 5 to 40 μm. If the average particle diameter is less than 1 μm, the particle diameter is excessively small, and manufacture of the phosphors is thus difficult, leading to an increase in costs. In addition, the fine powder having an average particle diameter of less than 1 μm has a high aggregating property, so that it is difficult to form a uniform phosphor layer. On the other hand, when the average particle diameter is excessively large to exceed 100 μm, the respective phosphor powder has an excessively large size, so that it becomes difficult to obtain a white light.

It is preferable that, when the phosphor is excited by a light emission source of 350 to 420 nm, the light emission peak wavelength of the phosphor preferably be in a range of 420 to 700 nm.

It is preferable that such a white light source have a light emission color temperature of 2,500 to 7,000 K. If this color temperature falls below 2,500 K and exceeds 7,000 K, there may be a fear that such color temperature do not exist in the natural light. The more preferable range of the color temperature is 2,700 to 6,700 K. The color temperature can be controlled by adjusting a mixing ratio of the four or more types of phosphor.

The material for constituting each phosphor is not particularly limited as long as the light emission peak thereof is in a range of 420 to 700 nm, and the following phosphors are preferable as phosphors excited at 350 to 420 nm. Further, the half-value width (half band width) of the peak wavelength of the light emission spectrum of each phosphor is as wide as preferably 40 nm or more and more preferably 50 to 100 nm. When the above half-value width is within the above range, as previously described, an overlapped portion of the light emission spectra is easily formed among the phosphors having different peak wavelengths, so that the effect of mutual light-absorption (mutually light-absorbing effect) can be easily imparted to the phosphors.

Concrete examples of the blue phosphor (B) may include a europium-activated alkaline-earth phosphate phosphor (a peak wavelength of 440 to 455 nm) and a europium-activated barium magnesium aluminate phosphor (a peak wavelength of 450 to 460 nm) or the like. Further, examples of the blue-green phosphor may include a europium-activated strontium aluminate phosphor (a peak wavelength of 480 to 500 nm) and a europium- and manganese-activated barium magnesium aluminate phosphor (a peak wavelength of 510 to 520 nm) or the like.

Concrete examples of the green phosphor (G) may include a europium-activated orthosilicate phosphor (a peak wavelength of 520 to 550 nm), a europium-activated β-sialon phosphor (a peak wavelength of 535 to 545 nm), and a europium-activated strontium sialon phosphor (a peak wavelength of 510 to 530 nm) or the like.

Concrete examples of the yellow phosphor (Y) may include a europium-activated orthosilicate phosphor (a peak wavelength of 550 to 580 nm) and a cerium-activated rare-earth aluminum garnet phosphor (a peak wavelength of 550 to 580 nm) or the like.

Concrete examples of the red phosphor (R) may include a europium-activated strontium sialon phosphor (a peak wavelength of 600 to 650 nm), a europium-activated calcium strontium oxynitride phosphor (a peak wavelength of 610 to 650 nm), a europium-activated lanthanum oxysulfide phosphor (a peak wavelength of 620 to 630 nm), a manganese-activated magnesium fluorogermanate (a peak wavelength of 640 to 660 nm), and a europium-activated alkaline-earth nitride phosphor (a peak wavelength of 600 to 650 nm) or the like.

In particular, according to the europium-activated strontium sialon phosphor (a peak wavelength of 600 to 650 nm) and the europium-activated calcium strontium nitride phosphor (a peak wavelength of 610 to 650 nm), the effect of mutual light-absorption can be easily obtained, thus being preferable.

In order to control the difference $A(\lambda)$, it is preferable to use four or more types (more preferably five or more types) of phosphor from among the above-mentioned examples of the blue phosphor, the blue-green phosphor, the green phosphor, the yellow phosphor, and the red phosphor. Further, the color temperature can be controlled by changing the mixing proportion of the phosphors.

Further, it is preferable that a space is formed to a portion between the phosphor layer and the light emitting diode. Furthermore, it is also preferable that the phosphor layer is provided on the light emitting diode. Still further, it is also preferable that the phosphor layer is provided on the light emitting diode through a transparent resin layer.

Figure 10:
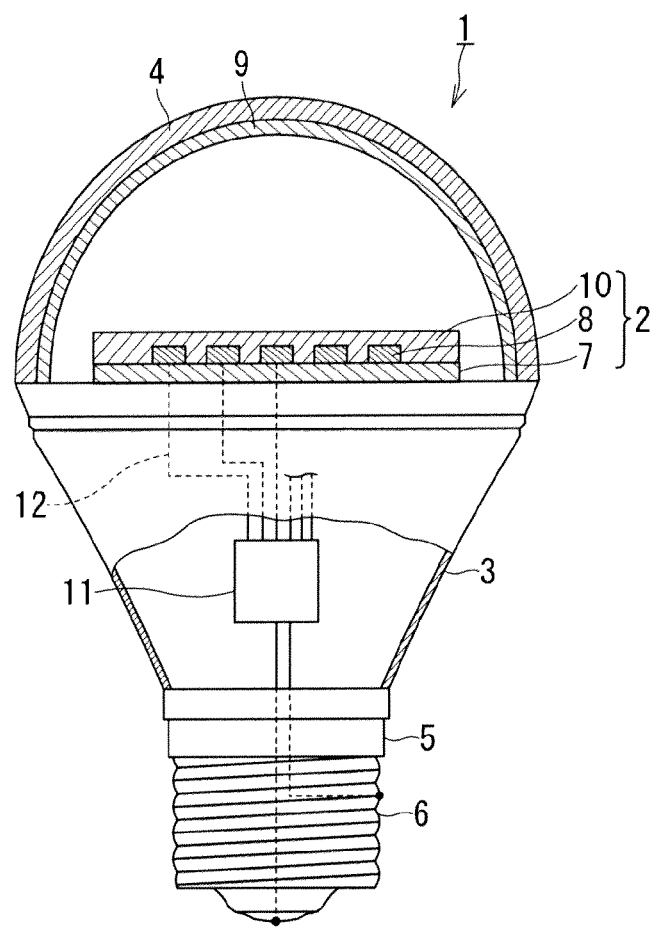
FIG. 10 is a cross sectional view illustrating an embodiment of a bulb-type white light source according to the present invention.

Next, a structure of the white light source will be explained. FIG. 10 illustrates a bulb-type white light source as an embodiment of the white light source according to the present invention. In FIG. 10, a reference numeral of 1 denotes an LED bulb (white light source), 2 denotes an LED module, 3 denotes a base body, 4 denotes a globe, 5 denotes an insulating member, 6 denotes a cap, 7 denotes a substrate, 8 denotes LED chips, 9 denotes a phosphor layer, and 10 denotes a transparent resin layer. FIG. 10 shows one example of a structure for the white light source in which the space is formed to a portion between the phosphor layer and the light emitting diode.

That is, the LED bulb 1 illustrated in FIG. 10 includes: the LED module 2; the base body 3 to which the LED module 2 is arranged; the globe (housing) 4 that is attached to an upper portion of the base body 3 so as to cover the LED module 2; the cap 6 that is attached to a lower end part of the base body 3 with the intermediation of the insulating member 5; and a lighting circuit 11 provided inside of the base body 3.

The LED module 2 includes the LED chips 8 having peak wavelengths of 350 to 420 nm and are mounted on the substrate 7. The plurality of LED chips 8 are surface-mounted on the substrate 7. For example, InGaN-based, GaN-based, and AlGaN-based light emitting diodes or the like are used for the LED chips 8 that emit ultraviolet to violet light.

A wiring network (not illustrated) is provided on a surface of the substrate 7 (further provided inside thereof as needed), and an electrode of each LED chip 8 is electrically connected to the wiring network of the substrate 7. Wiring lines 12 are drawn out from a side surface or a bottom surface of the LED module 2, and the wiring lines 12 are electrically connected to the lighting circuit 11 provided inside of the base body 3. The LED chips 8 are turned on by DC voltage applied via the lighting circuit 11.

The phosphor layer 9 that absorbs ultraviolet to violet light emitted from the LED chips 8 and emits white light is provided on an inner surface of the globe 4. The phosphor layer 9 is formed by combining four or more types (more preferably five or more types) of phosphor having different peak wavelengths. Further, the phosphors are mixed with resin to form the phosphor layer 9. Further, all the phosphors may be mixed to form a mixed phosphor layer. Alternatively, phosphor layers formed by mixing about one to three types of phosphor are laminated to form a multi-layered phosphor layer.

Although FIG. 10 illustrates a structure in which the phosphor layer is provided on the inner surface of the globe 4, the phosphor layer may be provided on an outer surface of the globe 4, or the phosphors may be mixed in a resin globe 4 itself.

Further, not limited to the above-mentioned bulb types, the white light source according to the present invention can also be applied to a fluorescent light type (elongated type), a chandelier type, and the like, and the shape thereof is not particularly limited.

Although FIG. 10 illustrates the bulb-type white light source, the present invention is not limited thereto, and can also be applied to a structure in which the phosphor layer is provided on the light emitting diode. It is preferable that a thickness of the transparent resin layer is set to within a range of 0.01 to 0.1 mm.

As described above, the difference $A(\lambda)$ is controlled to satisfy $-0.2 \leq A(\lambda) \leq +0.2$, whereby a white light source that reproduces natural light can be provided. Further, white light sources that reproduce the natural light in the daytime, the natural light at sunrise, the natural light in the morning, the natural light in the evening, and the like are combined, whereby a white light source system that reproduces a rhythm of one-day natural light can be configured. As a result, it is possible to provide a white light source and a white light source system that suppress adverse effects on a human body circadian rhythm.

EXAMPLES

Example 1

Light emitting diodes each having a light emission peak wavelength of 400 nm were prepared as LED chips. Next, prepared was a mixture including: a europium-activated alkaline earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emit light while being irradiated with electromagnetic waves of 400 nm.

The average particle diameter of the respective phosphors was set to 18 μm. The respective phosphors were mixed at a ratio by weight (ratio by mass) of blue phosphor:blue-green phosphor:green phosphor:yellow phosphor:red phosphor=30:15:20:15:20, were mixed with a transparent resin (silicone resin), and was applied to the globe inner surface, whereby the bulb-type white light source illustrated in FIG. 10 was manufactured.

The correlated color temperature of light emission color of thus obtained white light source was 5,100 K. This color temperature of 5,100 K is equivalent to the color temperature of the natural light in daytime.

Further, the thickness of the phosphor layer was set to 0.6 mm. Furthermore, the europium-activated strontium sialon red phosphor is a phosphor which is excited by not only the light emitted from a LED chip but also the light emitted from the blue phosphor or the like.

FIG. 6 shows a result obtained by measuring the light emission spectrum of the bulb-type white light source in Example 1 according to total luminous flux measurement using an integrating sphere in conformity with JIS-C-8152. Further, FIG. 7 shows $(P(\lambda) \times V(\lambda))/(P(\lambda max1) \times V(\lambda max1))$ in Example 1, which is obtained by using the spectral luminous distribution $V(\lambda)$ in FIG. 1. Note that $\lambda max1$ in Example 1 is 556 nm.

Then, FIG. 3 shows the light emission spectrum of blackbody radiation having a color temperature of 5,100 K, which is obtained according to Planck's distribution (the expression in FIG. 2). FIG. 8 shows $(B(\lambda) \times V(\lambda))/(B(\lambda max2) \times V(\lambda max2))$, which is obtained by assuming that the light emission spectrum in FIG. 3 is $B(\lambda)$. Note that $\lambda max2$ is 556 nm.

The difference $A(\lambda)$ in Example 1 was obtained according to $[(P(\lambda) \times V(\lambda))/(P(\lambda max1) \times V(\lambda max1)) - (B(\lambda) \times V(\lambda))/(B(\lambda max2) \times V(\lambda max2))]$. FIG. 9 shows the result thereof. As is apparent from FIG. 9, in the white light source in Example 1, the difference $A(\lambda)$ from the light emission spectrum of the natural light in the daytime was in a range of −0.2 to +0.2 in a visible light region of 380 to 780 nm. Specifically, the concrete difference A(λ) was −0.03 to +0.02.

Example 2

Light emitting diodes each having a light emission peak wavelength of 400 nm were prepared as LED chips. Next, prepared was a mixture including: a europium-activated alkaline earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 400 nm.

The average particle diameter of the phosphors was set to 13 μm. The respective phosphors were mixed at a ratio by weight (ratio by mass) of blue phosphor:blue-green phosphor:green phosphor:yellow phosphor:red phosphor=10:15:25:20:30, was mixed with a transparent resin (silicone resin), and was applied to the globe inner surface, whereby the bulb-type white light source illustrated in FIG. 10 was manufactured. The correlated color temperature of light emission color of the obtained white light source was 4,200 K. This color temperature of 4,200 K is equivalent to the color temperature of the natural light in the morning.

Further, the thickness of the phosphor layer was set to 0.4 mm. Furthermore, the europium-activated strontium sialon red phosphor is a phosphor which is excited by not only the light emitted from the LED chip but also the light emitted from the blue phosphor or the like.

Figure 11:
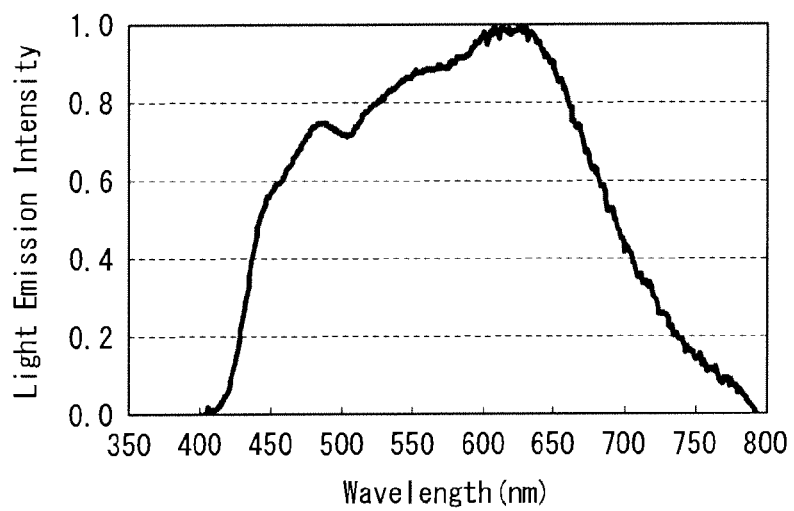
FIG. 11 is a graph showing the light emission spectrum of a white light source in Example 2.
Figure 12:
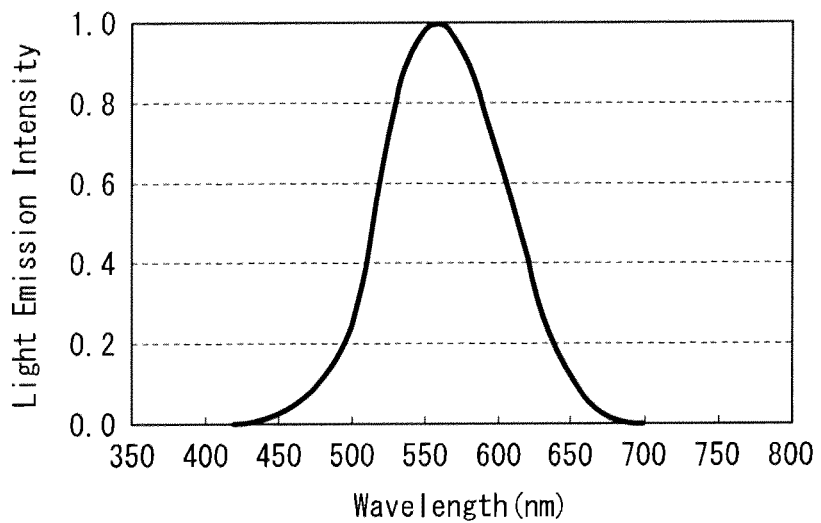
FIG. 12 is a graph showing $(P(\lambda) \times V(\lambda))/(P(\lambda max1) \times V(\lambda max1))$ in Example 2.

Similarly to Example 1, the light emission spectrum of the white light source in Example 2 was checked according to total luminous flux measurement using an integrating sphere. FIG. 11 shows the result thereof. FIG. 12 shows (P(λ)×V(λ))/(P(λmax1)×V(λmax1)) in Example 2, which is obtained by using the spectral luminous efficiency V(λ) shown in FIG. 1. Note that λmax1 in Example 2 is 560 nm.

Figure 13:
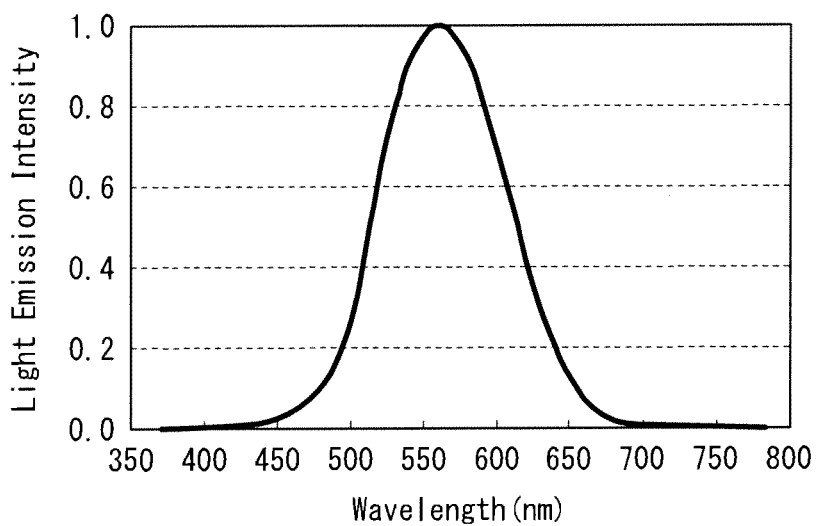
FIG. 13 is a graph showing $(B(\lambda) \times V(\lambda))/(B(\lambda max2) \times V(\lambda max2))$, assuming that a black-body radiation having the same color temperature as in FIG. 4 is $B(\lambda)$.

Then, FIG. 4 shows the light emission spectrum of blackbody radiation having a color temperature of 4,200 K, which is obtained according to Planck's distribution (the expression in FIG. 2). FIG. 13 shows (B(λ)×V(λ))/(B(λmax2)×V(λmax2)), which is obtained by assuming that the light emission spectrum in FIG. 4 is B(λ). Note that λmax2 is 560 nm.

Figure 14:
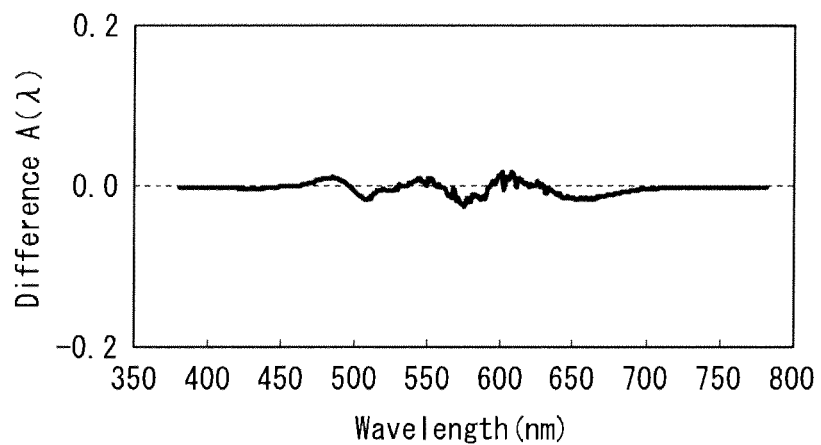
FIG. 14 is a graph showing a difference $A(\lambda)$ in Example 2.

The difference A(λ) in Example 2 was obtained according to [(P(λ)×V(λ))/(P(λmax1)×V(λmax1))−(B(λ)×V(λ))/(B(λmax2)×V(λmax2))]. FIG. 14 shows the result thereof. As is apparent from FIG. 14, in the white light source in Example 2, the difference A(λ) from the light emission spectrum of the natural light in the morning is in a range of −0.2 to +0.2 in a visible light region of 380 to 780 nm. Specifically, the concrete difference A(λ) is −0.04 to +0.03.

Example 3

Light emitting diodes each having a light emission peak wavelength of 400 nm were prepared as LED chips. Prepared was a mixture including: a europium-activated alkaline earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 400 nm.

The average particle diameter of the phosphors was set to 15 μm. The phosphors were mixed at a ratio by weight of blue-phosphor:blue-green phosphor:green phosphor:yellow phosphor:red phosphor=5:10:20:25:40, was mixed with a transparent resin (silicone resin), and was applied to the globe inner surface, whereby the bulb-type white light source illustrated in FIG. 10 was manufactured. The correlated color temperature of light emission color of the obtained white light source was 2,700 K. This color temperature of the white light source is equivalent to the color temperature of the natural light at sunrise.

Further, the thickness of the phosphor layer was set to 0.5 mm. Furthermore, the europium-activated strontium sialon red phosphor is a phosphor which is excited by not only the light emitted from the LED chip but also the light emitted from the blue phosphor or the like.

Figure 15:
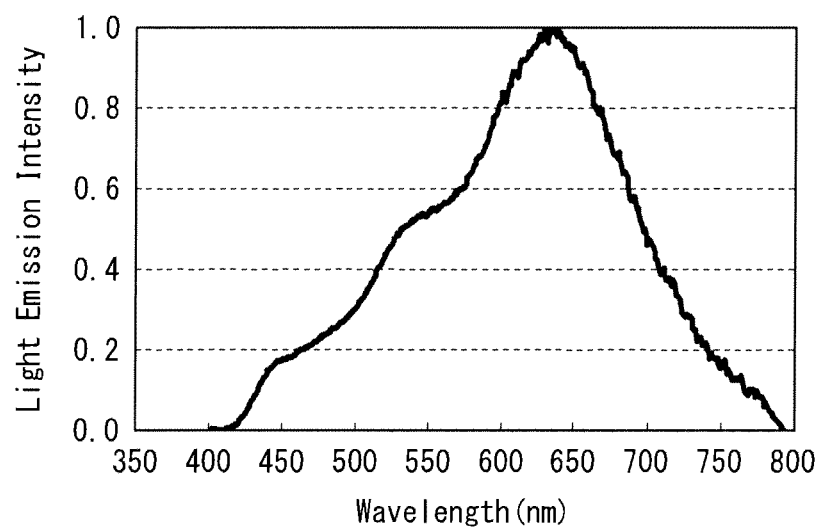
FIG. 15 is a graph showing a light emission spectrum in Example 3.
Figure 16:
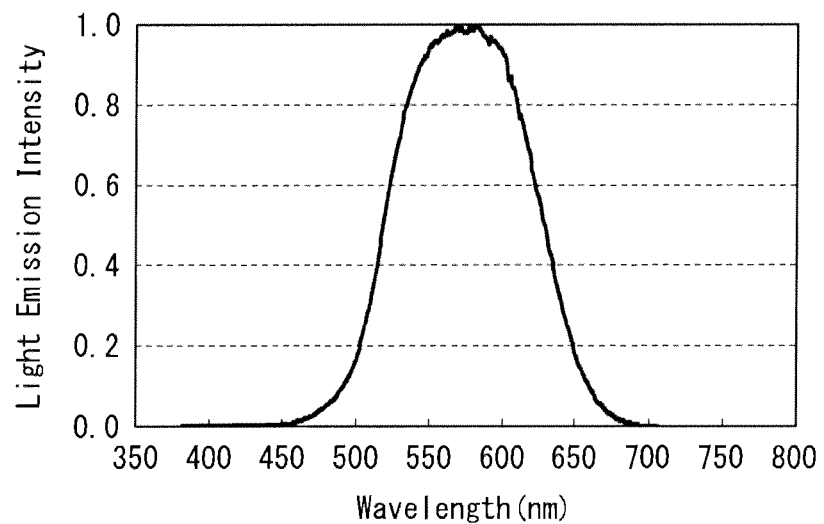
FIG. 16 is a graph showing $(P(\lambda) \times V(\lambda))/(P(\lambda max1) \times V(\lambda max1))$ in Example 3.

Similarly to Example 1, the light emission spectrum of the white light source in Example 3 was checked according to total luminous flux measurement using an integrating sphere. FIG. 15 shows the result thereof. FIG. 16 shows (P(λ)×V(λ))/(P(λmax1)×V(λmax1)) in Example 3, which is obtained using the spectral luminous efficiency V(λ) shown in FIG. 1. Note that λmax1 in Example 3 is 570 nm.

Figure 17:
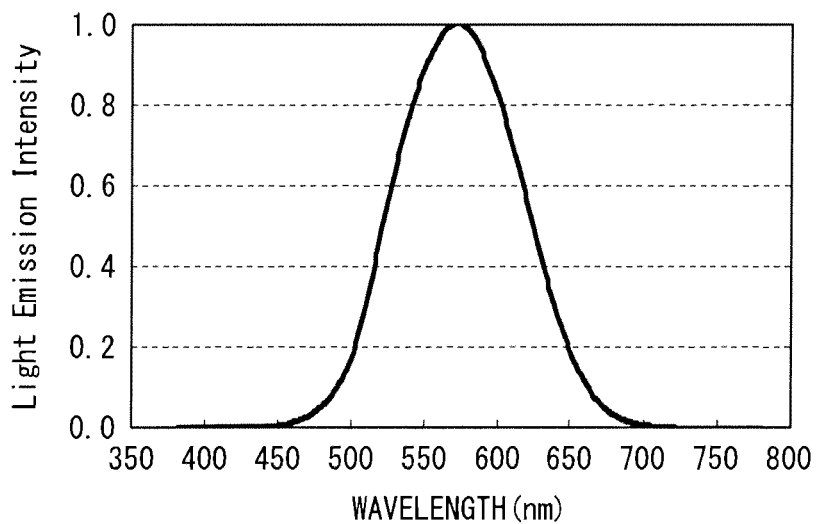
FIG. 17 is a graph showing $(B(\lambda) \times V(\lambda))/(B(\lambda max2) \times V(\lambda max2))$, assuming that a black-body radiation having the same color temperature as in FIG. 5 is $B(\lambda)$.

Then, FIG. 5 shows the light emission spectrum of blackbody radiation having a color temperature of 2,700 K, which is obtained according to Planck's distribution (the expression in FIG. 2). FIG. 17 shows (B(λ)×V(λ))/(B(λmax2)×V(λmax2)), which is obtained by assuming that the light emission spectrum in FIG. 5 is B(λ). Note that λmax2 is 570 nm.

Figure 18:
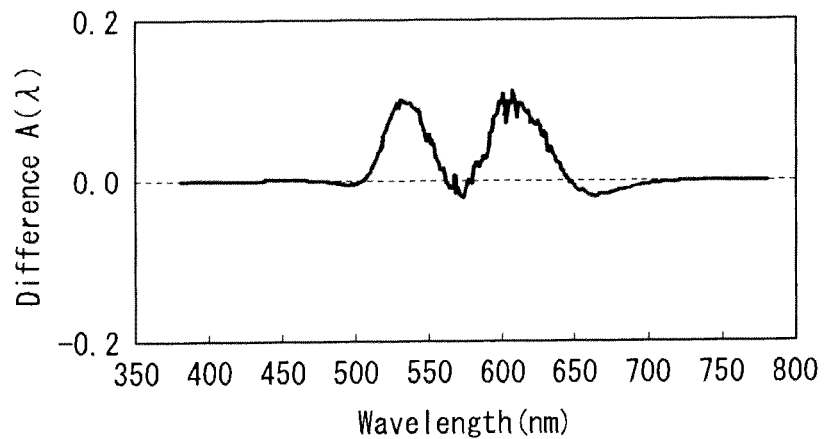
FIG. 18 is a graph showing a difference $A(\lambda)$ in Example 3.

The difference A(λ) in Example 3 was obtained according to [(P(λ)×V(λ))/(P(λmax1)×V(λmax1))−(B(λ)×V(λ))/(B(λmax2)×V(λmax2))]. FIG. 18 shows the result thereof. As is apparent from FIG. 18, in the white light source in Example 3, the difference A(λ) from the light emission spectrum of the natural light at sunrise is in a range of −0.2 to +0.2 in a visible light region of 380 to 780 nm. Specifically, the concrete difference A(λ) is −0.03 to +0.15.

Example 4

Light emitting diodes each having a light emission peak wavelength of 410 nm were prepared as LED chips. Next, prepared was a mixture including: a europium-activated barium magnesium aluminate blue phosphor having a peak wavelength of 450 nm; a europium-manganese activated barium magnesium aluminate blue-green phosphor having a peak wavelength of 515 nm; a europium-activated orthosilicate green phosphor having a peak wavelength of 530 nm; a europium-activated orthosilicate yellow phosphor having a peak wavelength of 555 nm; and a europium-activated calcium strontium oxynitride red phosphor having a peak wavelength of 630 nm, as phosphors that emitted light while being irradiated with electromagnetic waves of 410 nm.

By the way, the average particle diameter of the phosphors was set to 22 μm. The respective phosphors were mixed at a ratio by weight (ratio by mass) of blue phosphor:blue-green phosphor:green phosphor:yellow phosphor:red phosphor=30:20:15:20:15, was mixed with a transparent resin (silicone resin), and a phosphor mixture is applied to an inner surface of a globe, thereby to manufacture a globe-type white light source.

The correlated color temperature of light emission color of thus obtained white light source was 5,100 K. This color temperature of 5,100 K is equivalent to the color temperature of the natural light in daytime.

Further, the thickness of the phosphor layer was set to 0.4 mm. Furthermore, the europium-activated strontium sialon red phosphor is a phosphor which is excited by not only the light emitted from the LED chip but also the light emitted from the blue phosphor or the like.

Similarly to Example 1, the light emission spectrum of the white light source in Example 4 was checked according to total luminous flux measurement using an integrating sphere. Further, $(P(\lambda) \times V(\lambda))/(P(\lambda max1) \times V(\lambda max1))$ in Example 4 was obtained by using the spectral luminous efficiency $V(\lambda)$ shown in FIG. 1. Note that $\lambda max1$ in Example 4 is 556 nm.

Then, the light emission spectrum of black-body radiation having a color temperature of 5,100 K was obtained according to Planck's distribution (the expression in FIG. 2). Further, $(B(\lambda) \times V(\lambda))/(B(\lambda max2) \times V(\lambda max2))$ was obtained by assuming that the light emission spectrum of the black body radiation is $B(\lambda)$. Note that $\lambda max2$ is 556 nm.

The difference $A(\lambda)$ in Example 4 was obtained according to $[(P(\lambda) \times V(\lambda))/(P(\lambda max1) \times V(\lambda max1)) - (B(\lambda) \times V(\lambda))/(B(\lambda max2) \times V(\lambda max2))]$. In the white light source in Example 4, the difference $A(\lambda)$ from the light emission spectrum of the natural light in daytime is in a range of −0.2 to +0.2 in a visible light region of 380 to 780 nm. Specifically, the concrete difference $A(\lambda)$ is −0.18 to +0.19.

Comparative Example 1

A blue light emitting diode having a light emission peak wavelength of 460 nm was combined with a cerium-activated yttrium aluminum garnet yellow phosphor (having an average particle diameter of 6 μm), whereby a white light source of Comparative Example 1 was manufactured.

Figure 19:
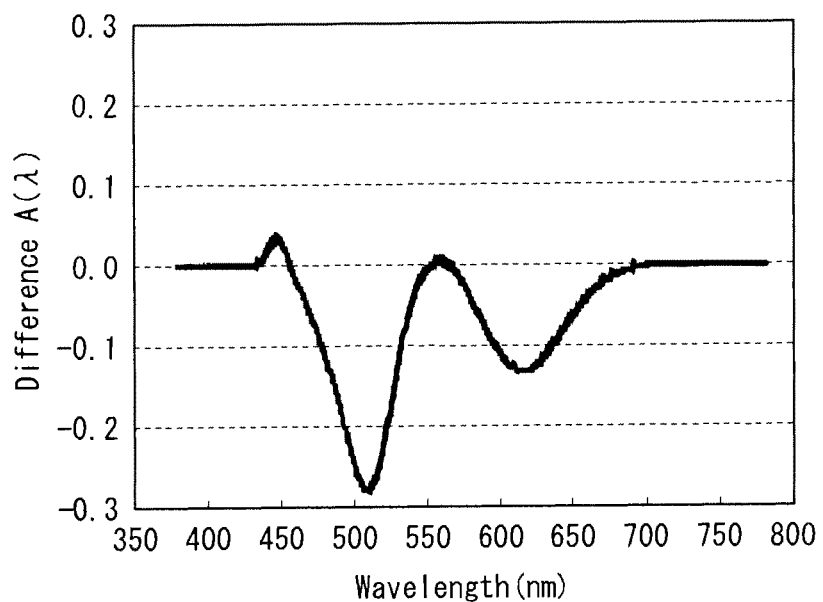
FIG. 19 is a graph showing a difference $A(\lambda)$ in Comparative Example 1.

The color temperature of the white light source in Comparative Example 1 was 5,100 K, and the difference $A(\lambda)$ thereof was −0.28 to +0.04 as shown in FIG. 19.

In this regard, the phosphor layer was formed in such a manner that a transparent resin (silicone resin) was mixed with cerium-activated yttrium aluminum garnet yellow phosphor, followed by directly applying the mixture onto the light emitting diode thereby to form the phosphor layer having a thickness of 0.1 mm.

Comparative Example 2

Light emitting diodes each having a light emission peak wavelength of 400 nm were prepared as LED chips. Next, prepared was a mixture including: a europium-activated alkaline earth phosphate blue phosphor having a peak wavelength of 445 nm; a europium-activated orthosilicate green phosphor having a peak wavelength of 530 nm; and a europium-activated strontium sialon red phosphor having a peak wavelength of 625 nm, as phosphors that emitted light while being irradiated with electromagnetic waves of 400 nm. The average particle diameter of the respective phosphors was set to 28 μm.

The respective phosphors were mixed at a ratio by weight (ratio by mass) of blue phosphor:green phosphor:red phosphor=30:40:30, was mixed with a transparent resin (silicone resin), and was applied to the globe inner surface, whereby the bulb-type white light source illustrated in FIG. 10 was manufactured.

The correlated color temperature of light emission color of thus obtained white light source was 5,000 K. This color temperature is equivalent to the color temperature of the natural light in daytime.

Further, the thickness of the phosphor layer was set to 1.2 mm. Furthermore, the europium-activated strontium sialon red phosphor is a phosphor which is excited by not only the light emitted from the LED chip but also the light emitted from the blue phosphor or the like. In Comparative Example 2, three types of phosphors each having a different peak wavelengths were used.

Figure 21:
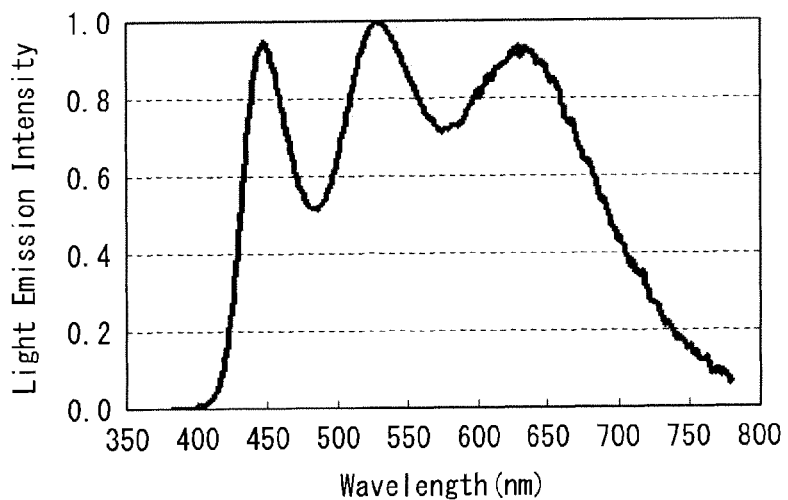
FIG. 21 is a graph showing the light emission spectrum $P(\lambda)$ of a white light source in Comparative Example 2.

As the same manner as in Example 1, the light emission spectrum $P(\lambda)$ of the white light source of Comparative Example 2 was measured according to the total luminous flux measurement using an integrating sphere. FIG. 21 shows a result obtained by the measuring.

Figure 23:
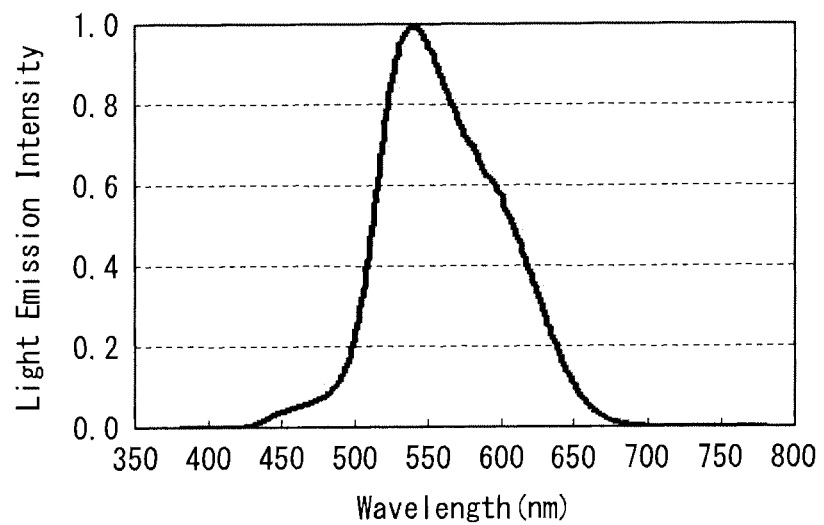
FIG. 23 is a graph showing $(P(\lambda) \times V(\lambda))/(P(\lambda max1) \times V(\lambda max1))$ of a white light source in Comparative Example 2.

Further, FIG. 23 shows $(P(\lambda) \times V(\lambda))/(P(\lambda max1) \times V(\lambda max1))$ in Comparative Example 2, which is obtained by using the standard spectral luminosity function $V(\lambda)$ in FIG. 1. Note that $\lambda max1$ in Comparative Example 2 is 540 nm.

Figure 22:
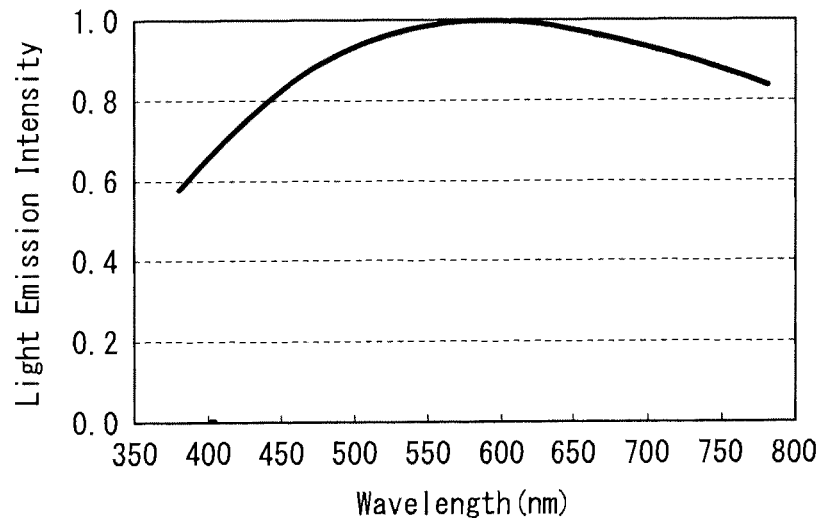
FIG. 22 is a graph showing a light emission spectrum $B(\lambda)$ of a black-body radiation having a color temperature of 5,000K.
Figure 24:
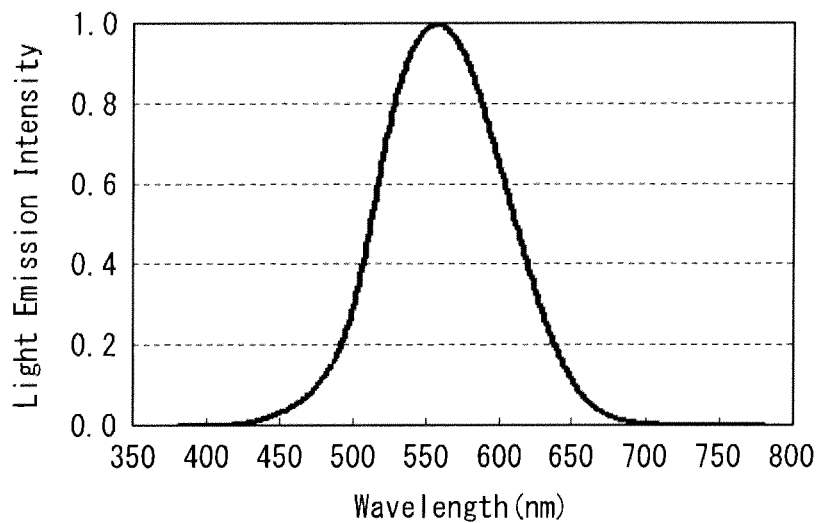
FIG. 24 is a graph showing $(B(\lambda) \times V(\lambda))/(B(\lambda max2) \times V(\lambda max2))$ of the white light source in Comparative Example 2.

Then, FIG. 22 shows the light emission spectrum of black-body radiation having a color temperature of 5,000 K, which is obtained according to Planck's distribution (the expression in FIG. 2). FIG. 24 shows $(B(\lambda) \times V(\lambda))/(B(\lambda max2) \times V(\lambda max2))$, which is obtained by assuming that the light emission spectrum in FIG. 22 is $B(\lambda)$. Note that $\lambda max2$ is 555 nm.

Figure 25:
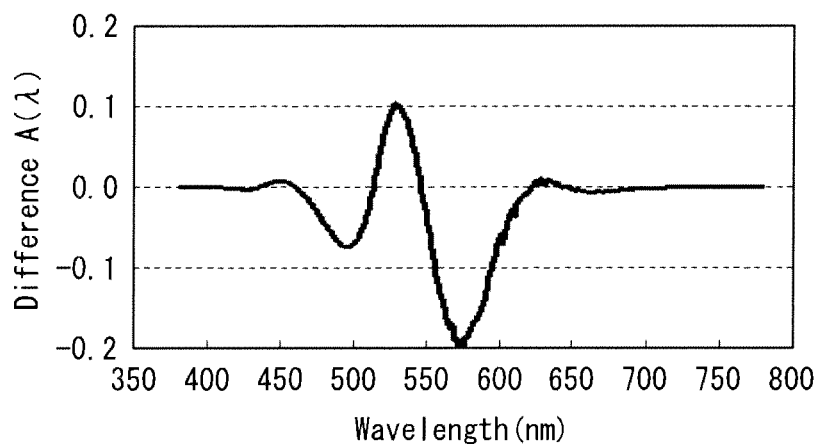
FIG. 25 is a graph showing a difference $A(\lambda)$ of a white light source in Comparative Example 2.

The difference $A(\lambda)$ in Comparative Example 2 was obtained according to $[(P(\lambda) \times V(\lambda))/(P(\lambda max1) \times V(\lambda max1)) - (B(\lambda) \times V(\lambda))/(B(\lambda max2) \times V(\lambda max2))]$. FIG. 25 shows the result thereof. As is apparent from FIG. 25, in the white light source in Comparative Example 2, the difference $A(\lambda)$ from the light emission spectrum of the natural light at sunrise was in a range of −0.2 to +0.2 in a visible light region of 380 to 780 nm. Specifically, the concrete difference $A(\lambda)$ was −0.2 to +0.1.

Subjects (ten persons) spent from 9:00 to 17:00 in the daytime under the white light source in each of the above-mentioned Examples 1 to 4 and Comparative Examples 1 to 2 at the same intensity of illumination, and the amount of secreted melatonin was measured at night (21:00) of the same day. Note that the amount of secreted melatonin was analyzed according to a saliva test. The amount of secreted melatonin (the average value of the ten persons) in each of the above-mentioned Examples and Comparative Example 2 was measured assuming that the amount of secreted melatonin in Comparative Example 1 was 100. Table 1 shows the results thereof.

TABLE 1

| Sample No. | Amount of Secreted Melatonin |
|---|---|
| Example 1 | 125 |
| Example 2 | 124 |
| Example 3 | 133 |
| Example 4 | 121 |
| Comparative Example 1 | 100 |
| Comparative Example 2 | 120 |

As is apparent from the results shown in Table 1, the amount of melatonin secreted in the subjects was larger in the white light source in each of the above-mentioned examples than that in the conventional white light source in Comparative Example 1. Melatonin is one of hormones secreted from the pineal body in a brain, and it is generally said that the amount of secreted melatonin is smaller during the day and is larger during the night. This is considered to be because humans live under natural light in the daytime. Hence, melatonin is considered as a hormone necessary to have restful sleep. Further, melatonin is widely used as supplements for preventing oxidation in the body in the U.S. and other countries.

Accordingly, with the use of the white light sources in the above-mentioned examples under circumstances where exposure to natural light is difficult (such as a hospital ward and a long-time indoor activity), an effect equivalent to that obtained by exposure to natural light can be obtained, and an effect of suppressing a sleep disorder and a circadian rhythm disturbance can be expected.

In the above-mentioned examples, the natural light in the daytime (Example 1, Example 4 and Comparative Example 2), the natural light at sunrise (Example 2), and the natural light in the morning (Example 3) were separately made. Alternatively, a white light source system is configured by combining the plurality of types of light as appropriate, whereby light equivalent to one-day natural light can be also reproduced.

Example 5

Light emitting diodes each having a light emission peak wavelength of 400 nm were prepared as LED chips. Next, prepared was a mixture including: a europium-activated alkaline earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm.

The average particle diameter of the phosphors was set to 10 μm. The respective phosphors were mixed at a ratio by weight (ratio by mass) of blue-phosphor:blue-green phosphor:green phosphor:yellow phosphor:red phosphor=30:15:20:15:20, was mixed with a transparent resin (silicone resin), and a phosphor layer was directly formed on the light emitting diode by using the mixture. Example 5 is a one-chip-type white light source.

Further, the thickness of the phosphor layer was set to 0.2 mm. Furthermore, the europium-activated strontium sialon red phosphor is a phosphor which is excited by not only the light emitted from the LED chip but also the light emitted from the blue phosphor or the like.

The correlated color temperature of light emission color of the obtained white light source was 5,100 K. This color temperature of 5,100 K is equivalent to the color temperature of the natural light in daytime. The light emission spectrum of Example 5 was checked. As a result, the light emission spectrum of Example 5 was the same as that of Example 1, and the difference A(λ) in Example 5 was −0.03 to +0.02.

Example 6

Light emitting diodes each having a light emission peak wavelength of 400 nm were prepared as LED chips. Next, prepared was a mixture including: a europium-activated alkaline earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted lights while being irradiated with electromagnetic waves of 400 nm.

The average particle diameter of the phosphors was set to 13 μm. The respective phosphors were mixed at a ratio by weight (ratio by mass) of blue phosphor:blue-green phosphor:green phosphor:yellow phosphor:red phosphor=10:15:25:20:30, was mixed with a transparent resin (silicone resin).

Next, a transparent resin layer having a thickness of 0.05 mm was provided onto the light emitting diode, and then a phosphor layer was provided on the transparent resin layer. The correlated color temperature of light emission color of the obtained white light source was 4,200 K. This color temperature of 4,200 K is equivalent to the color temperature of the natural light in the morning. Example 6 is a one-chip-type white light source. Further, the thickness of the phosphor layer was set to 0.2 mm. Furthermore, the europium-activated strontium sialon red phosphor is a phosphor which is excited by not only the light emitted from the LED chip but also the light emitted from the blue phosphor or the like.

The light emission spectrum of Example 6 was checked. As a result, the light emission spectrum of Example 6 was the same as that of Example 6, and the difference A(λ) in Example 4 was −0.04 to +0.03.

Example 7

Light emitting diodes each having a light emission peak wavelength of 400 nm were prepared as LED chips. Next, prepared was a mixture including: a europium-activated alkaline earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted lights while being irradiated with electromagnetic waves of 400 nm.

The average particle diameter of the phosphors was set to 13 μm. The respective phosphors were mixed at a ratio by weight (ratio by mass) of blue phosphor:blue-green phosphor:green phosphor:yellow phosphor:red phosphor=5:10:20:25:40, was mixed with a transparent resin (silicone resin).

Next, a transparent resin layer having a thickness of 0.03 mm was provided onto the light emitting diode, and then a phosphor layer was provided on the transparent resin layer. Example 7 is a one-chip-type white light source. Furthermore, the correlated color temperature of light emission color of thus obtained white light source was 2,700 K. This color temperature of 2,700 K is equivalent to the color temperature of the natural light at sunrise.

Further, the thickness of the phosphor layer was set to 0.1 mm. Furthermore, the europium-activated strontium sialon red phosphor is a phosphor which is excited by not only the light emitted from the LED chip but also the light emitted from the blue phosphor or the like.

The light emission spectrum of Example 7 was checked. As a result, the light emission spectrum of Example 7 was the same as that of Example 3, and the difference A(λ) in Example 7 was −0.03 to +0.15.

As the same measuring method as in Example 1, the amount of secreted melatonin in each of the white light sources of above-mentioned Examples 5 to 7 was measured. Table 2 hereunder shows the results thereof.

TABLE 2

| Sample No. | Amount of Secreted Melatonin |
|---|---|
| Example 5 | 120 |
| Example 6 | 120 |
| Example 7 | 127 |

As is apparent from the results shown in Table 2, the amount of melatonin secreted in the subjects was larger in the white light source in each of the above-mentioned examples than that in the conventional white light source in Comparative Example 1.

Although the respective Examples have been explained as one-chip type white light source in which the phosphor layer is provided to one LED chip, the present invention can be also applied to a multi-chip type white light source in which a plurality of LED chips are arranged and covered with one phosphor layer.

Figure 20:
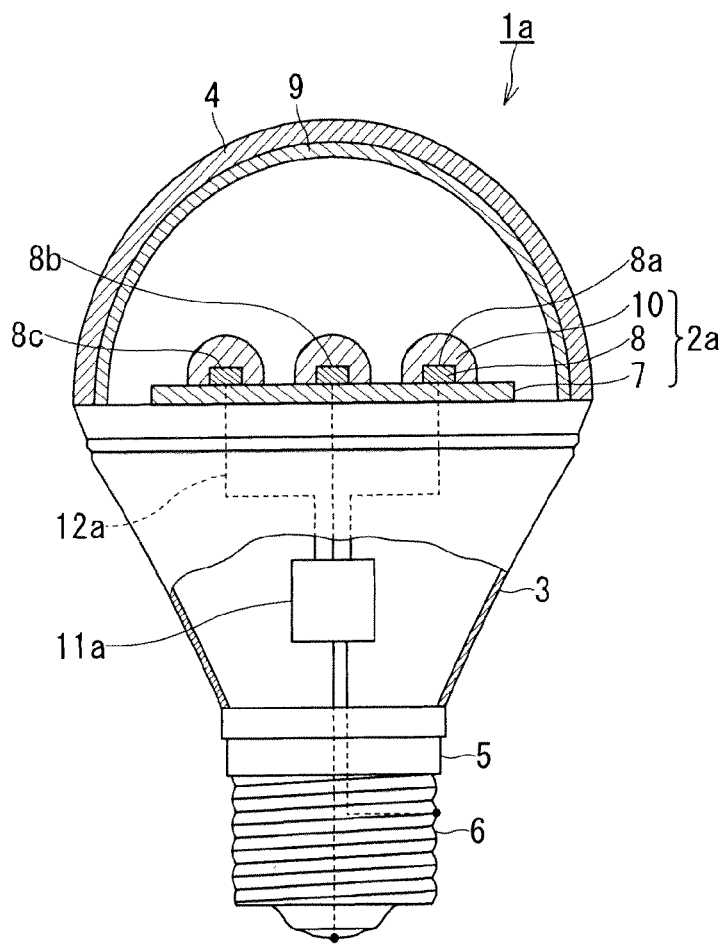
FIG. 20 is a cross sectional view illustrating another embodiment of the bulb-type white light source according to the present invention.

Specifically, as illustrated in FIG. 20, an LED chip 8a and a phosphor layer 9 for emitting the natural light in the daytime, an LED chip 8b and a phosphor layer 9 for emitting the natural light at sunrise, and an LED chip 8c and a phosphor layer 9 for emitting the natural light in the morning may be placed together on a common substrate 7. Then, the LED chips 8a, 8b, and 8c may be housed in the same globe 4, whereby a white light source system 1a may be configured. Further, a transparent resin layer may be formed at a portion between the LED chip and the phosphor layer.

The LED chips 8a, 8b, and 8c are each connected to a lighting circuit 11a by a wiring line 12a. A user can select an LED chip to be turned on by means of a switching mechanism (not illustrated) attached to the lighting circuit 11a, as desired.

According to the white light source system 1a configured as described above, the natural light in the daytime, the natural light at sunrise, and the natural light in the morning can be selectively enjoyed from one white light source system 1a, in accordance with a user's desire and an illumination cycle. That is, white light sources that reproduce the natural light in the daytime, the natural light at sunrise, the natural light in the morning, the natural light in the evening, and the like are combined, whereby a white light source system that reproduces a rhythm of one-day natural light can be configured.

Examples 8-12

As shown in Table 3, a combination of phosphors was changed and the respective phosphors were mixed so that the difference $A(\lambda)$ was set to fall within a range of −0.2 to +0.2, whereby the bulb-type white light source having a color temperature of 5,100 K, which is the same as that of Example 1, was manufactured.

The average particle diameter of the phosphor was set to fall within a range of 10 to 20 μm, and the thickness of the phosphor layer was set to fall within a range of 0.2 to 1.0 mm. Further, the red phosphor shown in Table 3 is excited by not only a light emitted from the LED but also a light emitted from the blue phosphor or the like.

TABLE 3

| Sample No. | Phosphor (Mixing Ratio:Mass Ratio %) | | | | | Difference $A(\lambda)$ |
| | Blue | Blue-Green | Green | Yellow | Red | |
|---|---|---|---|---|---|---|
| Example 8 | Eu-activated Alkaline Earth Phosphate Phosphor (45) | None | Eu-activated Ortho-silicate Phosphor (20) | Eu-activated Ortho-silicate Phosphor (20) | Eu-activated Strontium Sialon Phosphor (15) | −0.17~+0.19 |
| Example 9 | Eu-activated Alkaline Earth Phosphate Phosphor (45) | None | Eu-activated Ortho-silicate Phosphor (20) | Eu-activated Ortho-silicate Phosphor (15) | Eu-activated Alkaline Earth Nitride Phosphor (20) | −0.16~+0.17 |
| Example 10 | Eu-activated Alkaline Earth Phosphate Phosphor (40) | None | Eu-activated β sialon Phosphor (25) | Eu-activated Ortho-silicate Phosphor (20) | Eu-activated Strontium Sialon Phosphor (15) | −0.16~+0.18 |
| Example 11 | Eu-activated Alkaline Earth Phosphate Phosphor (30) | Eu-activated Strontium Aluminate Phosphor (20) | Eu-activated Ortho-silicate Phosphor (15) | Eu-activated Ortho-silicate Phosphor (20) | Eu-activated Alkaline Earth Nitride Phosphor (15) | −0.10~+0.12 |
| Example 12 | Eu-activated Alkaline-Earth Phosphate Phosphor (30) | Eu-activated Strontium Aluminate Phosphor (15) | Eu-activated β sialon Phosphor (20) | Eu-activated Ortho-silicate Phosphor (20) | Eu-activated Strontium Sialon Phosphor (15) | −0.09~+0.11 |

Examples 13-17

As shown in Table 4, a combination of phosphors was changed and the respective phosphors were mixed so that the difference $A(\lambda)$ was set to fall within a range of −0.2 to +0.2, whereby the bulb-type white light source having a color temperature of 4,200 K, which is the same as that of Example 2, was manufactured.

The average particle diameter of the phosphor was set to fall within a range of 10 to 20 μm, and the thickness of the phosphor layer was set to fall within a range of 0.2 to 1.0 mm. Further, the red phosphor shown in Table 4 is excited by not only a light emitted from the LED but also a light emitted from the blue phosphor or the like.

TABLE 4

| Sample No. | Phosphor (Mixing Ratio:Mass Ratio %) | | | | | Difference $A(\lambda)$ |
| --- | --- | --- | --- | --- | --- | --- |
| | Blue | Blue-Green | Green | Yellow | Red | |
| Example 13 | Eu-activated Alkaline Earth Phosphate Phosphor (25) | None | Eu-activated Ortho-silicate Phosphor (25) | Eu-activated Ortho-silicate Phosphor (20) | Eu-activated Strontium Sialon Phosphor (30) | −0.19~+0.18 |
| Example 14 | Eu-activated Alkaline Earth Phosphate Phosphor (25) | None | Eu-activated Ortho-silicate Phosphor (25) | Eu-activated Ortho-silicate Phosphor (15) | Eu-activated Alkaline Earth Nitride Phosphor (35) | −0.16~+0.15 |
| Example 15 | Eu-activated Alkaline Earth Phosphate Phosphor (20) | None | Eu-activated β sialon Phosphor (30) | Eu-activated Ortho-silicate Phosphor (20) | Eu-activated Strontium Sialon Phosphor (30) | −0.15~+0.17 |
| Example 16 | Eu-activated Alkaline Earth Phosphate Phosphor (10) | Eu-activated Strontium Aluminate Phosphor (15) | Eu-activated Ortho-silicate Phosphor (25) | Eu-activated Ortho-silicate Phosphor (20) | Eu-activated Alkaline Earth Nitride Phosphor (30) | −0.14~+0.13 |
| Example 17 | Eu-activated Alkaline Earth Phosphate Phosphor (10) | Eu-activated Strontium Aluminate Phosphor (10) | Eu-activated β sialon Phosphor (30) | Eu-activated Ortho-silicate Phosphor (20) | Eu-activated Strontium Sialon Phosphor (30) | −0.12~+0.14 |

Examples 18-22

As shown in Table 5, a combination of phosphors was changed and the respective phosphors were mixed so that the difference $A(\lambda)$ was set to fall within a range of −0.2 to +0.2, whereby the bulb-type white light source having a color temperature of 2,700 K, which is the same as that of Example 2, was manufactured.

The average particle diameter of the phosphor was set to fall within a range of 10 to 20 μm, and the thickness of the phosphor layer was set to fall within a range of 0.2 to 1.0 mm. Further, the red phosphor shown in Table 5 is excited by not only a light emitted from the LED but also a light emitted from the blue phosphor or the like.

TABLE 5

| Sample No. | Phosphor (Mixing Ratio:Mass Ratio %) | | | | | Difference $A(\lambda)$ |
| --- | --- | --- | --- | --- | --- | --- |
| | Blue | Blue-Green | Green | Yellow | Red | |
| Example 18 | Eu-activated Alkaline Earth | None | Eu-activated Ortho-silicate | Eu-activated Ortho-silicate | Eu-activated Strontium Sialon | −0.19~+0.19 |

TABLE 5-continued

| | Phosphor (Mixing Ratio:Mass Ratio %) | | | | | Difference |
|---|---|---|---|---|---|---|
| Sample No. | Blue | Blue-Green | Green | Yellow | Red | A(λ) |
| | Phosphate Phosphor (15) | | Phosphor (20) | Phosphor (25) | Phosphor (40) | |
| Example 19 | Eu-activated Alkaline Earth Phosphate Phosphor (15) | None | Eu-activated Ortho-silicate Phosphor (20) | Eu-activated Ortho-silicate Phosphor (20) | Eu-activated Alkaline Earth Nitride Phosphor (45) | −0.18~ +0.17 |
| Example 20 | Eu-activated Alkaline Earth Phosphate Phosphor (10) | None | Eu-activated β sialon Phosphor (25) | Eu-activated Ortho-silicate Phosphor (25) | Eu-activated Strontium Sialon Phosphor (40) | −0.19~ +0.18 |
| Example 21 | Eu-activated Alkaline Earth Phosphate Phosphor (5) | Eu-activated Strontium Aluminate Phosphor (10) | Eu-activated Ortho-silicate Phosphor (20) | Eu-activated Ortho-silicate Phosphor (25) | Eu-activated Alkaline Earth Nitride Phosphor (40) | −0.16~ +0.15 |
| Example 22 | Eu-activated Alkaline Earth Phosphate Phosphor (5) | Eu-activated Strontium Aluminate Phosphor (5) | Eu-activated β sialon Phosphor (25) | Eu-activated Ortho-silicate Phosphor (25) | Eu-activated Strontium Sialon Phosphor (40) | −0.14~ +0.16 |

Examples 1A-22A and Comparative Example 2A

The white light sources of Examples 1-22 and Comparative Example 2 were operated thereby to investigate a chromaticity change characteristic thereof.

An amount of the chromaticity change is measured by a method comprising the following steps. First, the light emission spectrum of the respective white light sources is measured by using an integrating sphere, thereby to obtain chromaticity coordinate (u', v') of the emitted light through a calculation. Then, a chromaticity coordinate (u', v') at a time after one hour have passed from the initially lighting up (turning on) the white light source.

Next, the white light source is continuously lighted up as it is for 6000 hours, and the chromaticity coordinate (u', v') at a time after 6000 hours have passed is measured. In this connection, the measuring operation was performed in an indoor environment having a room temperature (25° C.) and humidity of 60%.

From the chromaticity coordinate (u', v') at a time after one hour have passed and the chromaticity coordinate (u', v') at a time after 6000 hours have passed, differences Δu' and Δv' are obtained. As a result, the amount of chromaticity change (α) was obtained from a calculation formula:

$$\text{Amount of chromaticity change} = [(\Delta u')^2 + (\Delta v')^2]^{1/2}$$

Table 6 hereunder shows the results thereof.

TABLE 6

| Sample No. | White Light Source | Amount of Chromaticity Change After Continuous Lighting-up for 6000 Hours |
|---|---|---|
| Example 1A | Example 1 | 0.0064 |
| Example 2A | Example 2 | 0.0072 |
| Example 3A | Example 3 | 0.0057 |
| Example 4A | Example 4 | 0.0065 |
| Example 5A | Example 5 | 0.0065 |
| Example 6A | Example 6 | 0.0072 |
| Example 7A | Example 7 | 0.0059 |
| Example 8A | Example 8 | 0.0064 |
| Example 9A | Example 9 | 0.0078 |
| Example 10A | Example 10 | 0.0085 |
| Example 11A | Example 11 | 0.0071 |
| Example 12A | Example 12 | 0.0064 |
| Example 13A | Example 13 | 0.0064 |
| Example 14A | Example 14 | 0.0071 |
| Example 15A | Example 15 | 0.0078 |
| Example 16A | Example 16 | 0.0064 |
| Example 17A | Example 17 | 0.0072 |
| Example 18A | Example 18 | 0.0058 |
| Example 19A | Example 19 | 0.0064 |
| Example 20A | Example 20 | 0.0071 |
| Example 21A | Example 21 | 0.0064 |
| Example 22A | Example 22 | 0.0064 |
| Comparative Example 2A | Comparative Example 2 | 0.0122 |

As is apparent from the results shown in Table 6, the chromaticity change was confirmed to be suppressed in the white light sources of the respective Examples of the present invention. Therefore, it was also confirmed that there can be provided a white light source having a high reliability, and capable of reproducing a natural light, and suppressing the chromaticity change.

Example 23

Light emitting diodes each having a light emission peak wavelength of 400 nm were prepared as LED chips. Next, prepared was a mixture including: a europium-activated alkaline earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 400 nm.

The average particle diameter of the respective phosphors was set to 18 μm. The respective phosphors were mixed at a ratio by weight (ratio by mass) of blue phosphor:blue-green phosphor:green phosphor:yellow phosphor:red phosphor=30:15:20:15:20, were mixed with a transparent resin (silicone resin), and was applied to the globe inner surface, whereby the bulb-type white light source illustrated in FIG. 10 was manufactured.

The correlated color temperature of light emission color of thus obtained white light source was 5,100 K. This color temperature of 5,100 K is equivalent to the color temperature of the natural light in daytime.

Furthermore, the europium-activated strontium sialon red phosphor is a phosphor which is excited by not only the light emitted from a LED chip but also the light emitted from the blue phosphor or the like.

Further, the thickness of the phosphor layer was set to 0.4 mm. Furthermore, the mass ratio of the phosphor contained in the phosphor layer was 85 mass %. This value was obtained from a mass ratio of a total weight of the phosphor to be mixed, to a weight of the resin.

Next, the light emission spectrum of the bulb-type white light source in Example 23 was measured according to total luminous flux measurement using an integrating sphere in conformity with JIS-C-8152. The result of measuring was almost the same as in Example 1 shown in FIG. 6.

Further, $(P(\lambda) \times V(\lambda))/(P(\lambda max1) \times V(\lambda max1))$ in Example 23 was obtained by using the spectral luminous distribution $V(\lambda)$ shown in FIG. 1. Also, thus obtained result was almost the same as in Example 1 shown in FIG. 7. Note that $\lambda max1$ in Example 23 is 556 nm.

Then, FIG. 3 shows the light emission spectrum of blackbody radiation having a color temperature of 5,100 K, which is obtained according to Planck's distribution (the expression in FIG. 2). FIG. 8 shows $(B(\lambda) \times V(\lambda))/(B(\lambda max2) \times V(\lambda max2))$, which is obtained by assuming that the light emission spectrum in FIG. 3 is $B(\lambda)$. Note that $\lambda max2$ is 556 nm.

The difference $A(\lambda)$ in Example 23 was obtained according to $[(P(\lambda) \times V(\lambda))/(P(\lambda max1) \times V(\lambda max1)) - (B(\lambda) \times V(\lambda))/(B(\lambda max2) \times V(\lambda max2))]$. The result of measuring was almost the same as in Example 1 shown in FIG. 9. As is apparent from FIG. 9, in the white light source in Example 23, the difference $A(\lambda)$ from the light emission spectrum of the natural light in the daytime was in a range of −0.2 to +0.2 in a visible light region of 380 to 780 nm. Specifically, the concrete difference $A(\lambda)$ was −0.03 to +0.02.

Example 24

Light emitting diodes each having a light emission peak wavelength of 400 nm were prepared as LED chips. Next, prepared was a mixture including: a europium-activated alkaline earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 400 nm.

The average particle diameter of the phosphors was set to 13 μm. The respective phosphors were mixed at a ratio by weight (ratio by mass) of blue phosphor:blue-green phosphor:green phosphor:yellow phosphor:red phosphor=10:15:25:20:30, was mixed with a transparent resin (silicone resin), and was applied to the globe inner surface, whereby the bulb-type white light source illustrated in FIG. 10 was manufactured. The correlated color temperature of light emission color of the obtained white light source was 4,200 K. This color temperature of 4,200 K is equivalent to the color temperature of the natural light in the morning.

Further, the europium-activated strontium sialon red phosphor is excited by also the light emitted from the blue phosphor or the like.

Further, the thickness of the phosphor layer was set to 0.2 mm. Furthermore, the mass ratio of the phosphor contained in the phosphor layer was 80 mass %. This value was obtained from a mass ratio of a total weight of the phosphor to be mixed, to a weight of the resin.

Similarly to Example 1, the light emission spectrum of the white light source in Example 24 was checked according to total luminous flux measurement using an integrating sphere. The result thereof was the same as in Example 2 shown in FIG. 11. FIG. 12 shows $(P(\lambda) \times V(\lambda))/(P(\lambda max1) \times V(\lambda max1))$ in Example 24, which is obtained by using the spectral luminous efficiency $V(\lambda)$ shown in FIG. 1. Note that $\lambda max1$ in Example 24 is also 560 nm.

Then, FIG. 4 shows the light emission spectrum of blackbody radiation having a color temperature of 4,200 K, which is obtained according to Planck's distribution (the expression in FIG. 2). FIG. 13 shows $(B(\lambda) \times V(\lambda))/(B(\lambda max2) \times V(\lambda max2))$, which is obtained by assuming that the light emission spectrum in FIG. 4 is $B(\lambda)$. Note that $\lambda max2$ is 560 nm.

The difference $A(\lambda)$ in Example 24 was obtained according to $[(P(\lambda) \times V(\lambda))/(P(\lambda max1) \times V(\lambda max1)) - (B(\lambda) \times V(\lambda))/(B(\lambda max2) \times V(\lambda max2))]$. FIG. 14 shows the result thereof. As is apparent from FIG. 14, in the white light source in Example 24, the difference $A(\lambda)$ from the light emission spectrum of the natural light in the morning is in a range of −0.2 to +0.2 in a visible light region of 380 to 780 nm. Specifically, the concrete difference $A(\lambda)$ is −0.04 to +0.03.

Example 25

Light emitting diodes each having a light emission peak wavelength of 400 nm were prepared as LED chips. Prepared was a mixture including: a europium-activated alkaline earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 400 nm.

The average particle diameter of the phosphors was set to 15 μm. The phosphors were mixed at a ratio by weight of blue-phosphor:blue-green phosphor:green phosphor:yellow phosphor:red phosphor=5:10:20:25:40, was mixed with a transparent resin (silicone resin), and was applied to the globe inner surface, whereby the bulb-type white light source illustrated in FIG. 10 was manufactured. The correlated color temperature of light emission color of the obtained white light source was 2,700 K. This color temperature of the white light source is equivalent to the color temperature of the natural light at sunrise. Further, the europium-activated strontium sialon red phosphor is excited by also the light emitted from the blue phosphor or the like.

Further, the thickness of the phosphor layer was set to 0.3 mm. Furthermore, the mass ratio of the phosphor contained in the phosphor layer was 75 mass %. This value was obtained from a mass ratio of a total weight of the phosphor to be mixed, to a weight of the resin.

Similarly to Example 1, the light emission spectrum of the white light source in Example 25 was checked according to total luminous flux measurement using an integrating sphere. The result is shown in FIG. 15 which is almost the same as in Example 3. FIG. 16 shows $(P(\lambda) \times V(\lambda))/(P(\lambda max1) \times V(\lambda max1))$ in Example 25, which is obtained using the spectral luminous efficiency $V(\lambda)$ shown in FIG. 1. Note that $\lambda max1$ in Example 25 is 570 nm.

Then, FIG. 5 shows the light emission spectrum of black-body radiation having a color temperature of 2,700 K, which is obtained according to Planck's distribution (the expression in FIG. 2). FIG. 17 shows $(B(\lambda) \times V(\lambda))/(B(\lambda max2) \times V(\lambda max2))$, which is obtained by assuming that the light emission spectrum in FIG. 5 is $B(\lambda)$. Note that $\lambda max2$ is 570 nm.

The difference $A(\lambda)$ in Example 25 was obtained according to $[(P(\lambda) \times V(\lambda))/(P(\lambda max1) \times V(\lambda max1)) - (B(\lambda) \times V(\lambda))/(B(\lambda max2) \times V(\lambda max2))]$. The result is shown in FIG. 18 which is almost the same as in Example 3. As is apparent from FIG. 18, in the white light source in Example 25, the difference $A(\lambda)$ from the light emission spectrum of the natural light at sunrise is in a range of −0.2 to +0.2 in a visible light region of 380 to 780 nm. Specifically, the concrete difference $A(\lambda)$ is −0.03 to +0.15.

Example 26

Light emitting diodes each having a light emission peak wavelength of 410 nm were prepared as LED chips. Next, prepared was a mixture including: a europium-activated barium magnesium aluminate blue phosphor having a peak wavelength of 450 nm; a europium-manganese activated barium magnesium aluminate blue-green phosphor having a peak wavelength of 515 nm; a europium-activated orthosilicate green phosphor having a peak wavelength of 530 nm; a europium-activated orthosilicate yellow phosphor having a peak wavelength of 555 nm; and a europium-activated calcium strontium nitride red phosphor having a peak wavelength of 630 nm, as phosphors that emitted light while being irradiated with electromagnetic waves of 410 nm. By the way, the average particle diameter of the phosphors was set to 22 μm.

The respective phosphors were mixed at a ratio by weight (ratio by mass) of blue phosphor:blue-green phosphor:green phosphor:yellow phosphor:red phosphor=30:20:15:20:15, was mixed with a transparent resin (silicone resin), and a phosphor mixture is applied to an inner surface of a globe, thereby to manufacture a globe-type white light source.

The correlated color temperature of light emission color of thus obtained white light source was 5,100 K. This color temperature of 5,100 K is equivalent to the color temperature of the natural light in daytime. Further, the europium-activated calcium strontium nitride red phosphor is excited by also the light emitted from the blue phosphor or the like.

Further, the thickness of the phosphor layer was set to 0.5 mm. Furthermore, the mass ratio of the phosphor contained in the phosphor layer was 65 mass %. This value was obtained from a mass ratio of a total weight of the phosphor to be mixed, to a weight of the resin.

Similarly to Example 1, the light emission spectrum of the white light source in Example 26 was checked according to total luminous flux measurement using an integrating sphere. Further, $(P(\lambda) \times V(\lambda))/(P(\lambda max1) \times V(\lambda max1))$ in Example 26 was obtained by using the spectral luminous efficiency $V(\lambda)$ shown in FIG. 1. Note that $\lambda max1$ in Example 26 is 556 nm.

Then, the light emission spectrum of black-body radiation having a color temperature of 5,100 K was obtained according to Planck's distribution (the expression in FIG. 2). Further, $(B(\lambda) \times V(\lambda))/(B(\lambda max2) \times V(\lambda max2))$ was obtained by assuming that the light emission spectrum of the black body radiation is $B(\lambda)$. Note that $\lambda max2$ is 556 nm.

The difference $A(\lambda)$ in Example 26 was obtained according to $[(P(\lambda) \times V(\lambda))/(P(\lambda max1) \times V(\lambda max1)) - (B(\lambda) \times V(\lambda))/(B(\lambda max2) \times V(\lambda max2))]$. In the white light source in Example 26, the difference $A(\lambda)$ from the light emission spectrum of the natural light in daytime is in a range of −0.2 to +0.2 in a visible light region of 380 to 780 nm. Specifically, the concrete difference $A(\lambda)$ is −0.18 to +0.19.

Example 27

Light emitting diodes each having a light emission peak wavelength of 400 nm were prepared as LED chips. Prepared was a mixture including: a europium-activated alkaline earth phosphate blue phosphor having a peak wavelength of 445 nm; a europium-activated orthosilicate green phosphor having a peak wavelength of 530 nm; and a europium-activated strontium sialon red phosphor having a peak wavelength of 625 nm, as phosphors that emitted light while being irradiated with electromagnetic waves of 400 nm. The average particle diameter of the phosphors was set to 28 μm.

The phosphors were mixed at a ratio by weight of blue-phosphor:green phosphor:red phosphor=30:40:30, was mixed with a transparent resin (silicone resin), and was applied to the globe inner surface, whereby the bulb-type white light source illustrated in FIG. 10 was manufactured. The correlated color temperature of light emission color of the obtained white light source was 5,000 K. This color temperature of the white light source is equivalent to the color temperature of the natural light in daytime. Further, the europium-activated strontium sialon red phosphor is excited by also the light emitted from the blue phosphor or the like.

Further, the thickness of the phosphor layer was set to 1.0 min. Furthermore, the mass ratio of the phosphor contained in the phosphor layer was set to 80 mass %. This value was obtained from a mass ratio of a total weight of the phosphor to be mixed, to a weight of the resin.

Next, similarly to Example 1, the light emission spectrum of the white light source in Example 27 was checked according to total luminous flux measurement using an integrating sphere. $(P(\lambda) \times V(\lambda))/(P(\lambda max1) \times V(\lambda max1))$ in Example 27 was obtained using the spectral luminous efficiency $V(\lambda)$ shown in FIG. 1. Note that $\lambda max1$ in Example 27 is 540 nm.

Then, the light emission spectrum of black-body radiation having a color temperature of 5,000 K was obtained according to Planck's distribution (the expression in FIG. 2). Then, (B(λ)×V(λ))/(B(λmax2)×V(λmax2)) was obtained by assuming that the light emission spectrum in FIG. 22 is B(λ). Note that λmax2 is 555 nm.

The difference A(λ) in Example 27 was obtained according to [(P(λ)×V(λ))/(P(λmax1)×V(λmax1))−(B(λ)×V(λ))/(B(λmax2)×V(λmax2))]. As a result, in the white light source in Example 27, the difference A(λ) from the light emission spectrum of the natural light at sunrise is in a range of −0.2 to +0.2 in a visible light region of 380 to 780 nm. Specifically, the concrete difference A(λ) is −0.2 to +0.1.

Comparative Example 3

A blue light emitting diode having a light emission peak wavelength of 460 nm was combined with a cerium-activated yttrium aluminum garnet yellow phosphor (having an average particle diameter of 6 μm), whereby a white light source of Comparative Example 3 was manufactured.

The color temperature of the white light source in Comparative Example 3 was 5,100 K, and the difference A(λ) thereof was −0.28 to +0.04 as shown in FIG. 19.

In this regard, the phosphor layer was formed in such a manner that a transparent resin (silicone resin) was mixed with cerium-activated yttrium aluminum garnet yellow phosphor, followed by directly applying the mixture onto the light emitting diode thereby to form the phosphor layer having a thickness of 0.1 mm.

Furthermore, the mass ratio of the phosphor contained in the phosphor layer was set to 30 mass %. This value was obtained from a mass ratio of a total weight of the phosphor to be mixed, to a weight of the resin.

Subjects (ten persons) spent from 9:00 to 17:00 in the daytime under the white light source in each of the above-mentioned Examples 23 to 27 and Comparative Example 3 at the same intensity of illumination, and the amount of secreted melatonin was measured at night (21:00) of the same day. Note that the amount of secreted melatonin was analyzed according to a saliva test. The amount of secreted melatonin (the average value of the ten persons) in each of the above-mentioned Examples was measured assuming that the amount of secreted melatonin in Comparative Example 3 was 100. Table 7 shows the results thereof.

TABLE 7

| Sample No. | Amount of Secreted Melatonin |
| --- | --- |
| Example 23 | 127 |
| Example 24 | 126 |
| Example 25 | 135 |
| Example 26 | 125 |
| Example 27 | 120 |
| Comparative Example 3 | 100 |

As is apparent from the results shown in Table 7, the amount of melatonin secreted in the subjects was larger in the white light source in each of the above-mentioned examples than that in the conventional white light source in Comparative Example 3. Melatonin is one of hormones secreted from the pineal body in a brain, and it is generally said that the amount of secreted melatonin is smaller during the day and is larger during the night. This is considered to be because humans live under natural light in the daytime. Hence, melatonin is considered as a hormone necessary to have restful sleep. Further, melatonin is widely used as supplements for preventing oxidation in the body in the U.S. and other countries.

Accordingly, with the use of the white light sources in the above-mentioned examples under circumstances where exposure to natural light is difficult (such as a hospital ward and a long-time indoor activity), an effect equivalent to that obtained by exposure to natural light can be obtained, and an effect of suppressing a sleep disorder and a circadian rhythm disturbance can be expected.

In the above-mentioned examples, the natural light in the daytime (Example 23, Example 26 and Example 27), the natural light at sunrise (Example 24), and the natural light in the morning (Example 25) were separately made. Alternatively, a white light source system is configured by combining the plurality of types of light as appropriate, whereby light equivalent to one-day natural light can be also reproduced.

Example 28

Light emitting diodes each having a light emission peak wavelength of 400 nm were prepared as LED chips. Next, prepared was a mixture including: a europium-activated alkaline earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm. The average particle diameter of the phosphors was set to 10 μm.

The respective phosphors were mixed at a ratio by weight (ratio by mass) of blue-phosphor:blue-green phosphor:green phosphor:yellow phosphor:red phosphor=30:15:20:15:20, was mixed with a transparent resin (silicone resin), and a phosphor layer was directly formed on the light emitting diode by using the mixture. Example 28 is a one-chip-type white light source.

Further, the thickness of the phosphor layer was set to 0.3 mm. Furthermore, the mass ratio of the phosphor contained in the phosphor layer was set to 70 mass %. This value was obtained from a mass ratio of a total weight of the phosphor to be mixed, to a weight of the resin.

The correlated color temperature of light emission color of the obtained white light source was 5,100 K. This color temperature of 5,100 K is equivalent to the color temperature of the natural light in daytime. The light emission spectrum of Example 28 was checked. As a result, the light emission spectrum of Example 28 was the same as that of Example 23, and the difference A(λ) in Example 28 was −0.03 to +0.02.

Example 29

Light emitting diodes each having a light emission peak wavelength of 400 nm were prepared as LED chips. Next, prepared was a mixture including: a europium-activated alkaline earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted lights while being irradiated with electromagnetic waves of 400 nm.

The average particle diameter of the phosphors was set to 13 μm. The respective phosphors were mixed at a ratio by weight (ratio by mass) of blue phosphor:blue-green phosphor:green phosphor:yellow phosphor:red phosphor=10:15:25: 20:30, was mixed with a transparent resin (silicone resin).

Next, a transparent resin layer having a thickness of 0.05 mm was provided onto the light emitting diode, and then a phosphor layer was provided on the transparent resin layer. The correlated color temperature of light emission color of the obtained white light source was 4,200 K. This color temperature of 4,200 K is equivalent to the color temperature of the natural light in the morning. Example 29 is a one-chip-type white light source. Further, the thickness of the phosphor layer was set to 0.2 mm. Furthermore, the mass ratio of the phosphor contained in the phosphor layer was set to 60 mass %. This value was obtained from a mass ratio of a total weight of the phosphor to be mixed, to a weight of the resin.

The light emission spectrum of Example 29 was checked. As a result, the light emission spectrum of Example 29 was the same as that of Example 2, and the difference $A(\lambda)$ in Example 29 was −0.04 to +0.03.

Example 30

Light emitting diodes each having a light emission peak wavelength of 400 nm were prepared as LED chips. Next, prepared was a mixture including: a europium-activated alkaline earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted lights while being irradiated with electromagnetic waves of 400 nm.

The average particle diameter of the phosphors was set to 13 μm. The respective phosphors were mixed at a ratio by weight (ratio by mass) of blue phosphor:blue-green phosphor:green phosphor:yellow phosphor:red phosphor=5:10:20: 25:40, was mixed with a transparent resin (silicone resin).

Next, a transparent resin layer having a thickness of 0.03 mm was provided onto the light emitting diode, and then a phosphor layer was provided on the transparent resin layer. Example 30 is a one-chip type white light source. Furthermore, the correlated color temperature of light emission color of thus obtained white light source was 2,700 K. This color temperature is equivalent to the color temperature of the natural light at sunrise.

Further, the thickness of the phosphor layer was set to 0.3 mm. Furthermore, the mass ratio of the phosphor contained in the phosphor layer was set to 75 mass %. This value was obtained from a mass ratio of a total weight of the phosphor to be mixed, to a weight of the resin.

The light emission spectrum of Example 30 was checked. As a result, the light emission spectrum of Example 30 was the same as that of Example 25, and the difference $A(\lambda)$ in Example 7 was −0.03 to +0.15.

As the same measuring method as in Example 23, the amount of secreted melatonin in each of the white light sources of above-mentioned Examples 28 to 30 was measured. Table 8 hereunder shows the results thereof.

TABLE 8

| Sample No. | Amount of Secreted Melatonin |
| --- | --- |
| Example 28 | 120 |
| Example 29 | 120 |
| Example 30 | 129 |

As is apparent from the results shown in Table 8, the amount of melatonin secreted in the subjects was larger in the white light source in each of the above-mentioned examples than that in the conventional white light source in Comparative Example 3.

Although the respective Examples have been explained as one-chip type white light source in which the phosphor layer is provided to one LED chip, the present invention can be also applied to a multi-chip type white light source in which a plurality of LED chips are arranged and covered with one phosphor layer.

Further, as illustrated in FIG. 20, an LED chip 8a and a phosphor layer 9 for emitting the natural light in the daytime, an LED chip 8b and a phosphor layer 9 for emitting the natural light at sunrise, and an LED chip 8c and a phosphor layer 9 for emitting the natural light in the morning may be placed together on a common substrate 7. Then, the LED chips 8a, 8b, and 8c may be housed in the same globe 4, whereby a white light source system 1a may be configured. Further, a transparent resin layer may be formed at a portion between the LED chip and the phosphor layer.

The LED chips 8a, 8b, and 8c are each connected to a lighting circuit 11a by a wiring line 12a. A user can select an LED chip to be turned on by means of a switching mechanism (not illustrated) attached to the lighting circuit 11a, as desired.

According to the white light source system 1a configured as described above, the natural light in the daytime, the natural light at sunrise, and the natural light in the morning can be selectively enjoyed from one white light source system 1a, in accordance with a user's desire and an illumination cycle. That is, white light sources that reproduce the natural light in the daytime, the natural light at sunrise, the natural light in the morning, the natural light in the evening, and the like are combined, whereby a white light source system that reproduces a rhythm of one-day natural light can be configured.

Examples 23A-30A and Comparative Example 4A

The white light sources of Examples 23-30 were operated thereby to investigate a brightness degradating property thereof.

The brightness degradating property was measured by a method comprising the following steps. First, each of the white light sources is turned on (lighted up) in an integrating sphere, thereby to measure a total luminous flux thereof.

A measuring environment was a dark place having a normal temperature (25° C.) and a humidity of 60%. Under these environmental conditions, the total luminous flux at a time after one hour have passed from the initially turning on the white light source.

Next, the white light source is continuously turned on for 5000 hours, and the total luminous flux at a time after 5000 hours have passed was measured thereby to obtain a difference in brightness.

Concretely, the brightness degradation was obtained from a calculation formula:

Brightness Degradation=[(Brightness at time after turning on for one hour−Brightness at time after turning on for 5000 hours)/Brightness at time after turning on for one hour]×100(%)

Further, the white light source of Comparative Example 4A was manufactured so as to have the same structure as that of Example 27 except that an existing area ratio of the phosphor contained in the phosphor layer was set to 50%. Table 9 hereunder shows the measuring results thereof.

TABLE 9

| Sample No. | White Light Source | Brightness Degradation (%) |
|---|---|---|
| Example 23A | Example 23 | 2.3 |
| Example 24A | Example 24 | 1.8 |
| Example 25A | Example 25 | 1.5 |
| Example 26A | Example 26 | 2.4 |
| Example 27A | Example 27 | 3.3 |
| Example 28A | Example 28 | 2.7 |
| Example 29A | Example 29 | 1.8 |
| Example 30A | Example 30 | 2.8 |
| Comparative Example 4A | Comparative Example 4 | 7.1 |

As is apparent from the results shown in Table 9, the brightness degradation was confirmed to be suppressed in the white light sources of the respective Examples of the present invention. Among these Examples, the brightness degradation in other Examples using four or more types of phosphors was more effectively suppressed in comparison with that of Example 27 using three types of phosphors.

Further, the brightness degradation in the bulb-type white light sources (Examples 23 to 26) in which the phosphor layer is provided to the globe inner surface was more effectively suppressed than that of the one-chip type white light source (Examples 28 to 30). This reason is considered that a ratio of a portion irradiated by the light emitted from the light emitting diode in globe-type white light source becomes relatively small, so that an excitation density becomes small, whereby a deterioration of the phosphor is suppressed.

Therefore, it was also confirmed that the present invention can be provided a white light source having a high reliability, and capable of reproducing a natural light, and suppressing the brightness degradation.

1 . . . LED bulb (white light source), 1a . . . white light source system, 2, 2a . . . LED module, 3 . . . base body, 4 . . . globe, 5 . . . insulating member, 6 . . . cap, 7 . . . substrate, 8, 8a, 8b, 8c . . . LED chip, 9 . . . phosphor layer, 10 . . . transparent resin layer, 11, 11a . . . lighting circuit, 12, 12a . . . wiring line.

The invention claimed is:

1. A white light source comprising: a light emitting diode having a light emission peak wavelength in a range of 350 nm or more and 420 nm or less; and a phosphor layer including four or more types of phosphors and resin, wherein the white light source satisfies a relational equation of: $-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$, assuming that: a light emission spectrum of the white light source is $P(\lambda)$; a light emission spectrum of black-body radiation having a same color temperature as that of the white light source is $B(\lambda)$; a spectrum of a spectral luminous efficiency is $V(\lambda)$; a wavelength at which $P(\lambda) \times V(\lambda)$ becomes largest is $\lambda max1$; and a wavelength at which $B(\lambda) \times V(\lambda)$ becomes largest is $\lambda max2$, and wherein an amount of chromaticity change on CIE chromaticity diagram from a time of initial lighting up of the white light source to a time after the white light source is continuously lighted up for 6000 hours is less than 0.010.

2. A white light source comprising: a light emitting diode having a light emission peak wavelength in a range of 350 nm or more and 420 nm or less; and a phosphor layer including phosphor and resin, wherein the white light source satisfies a relational equation of:
$-0.2 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.2$,
assuming that: a light emission spectrum of the white light source is $P(\lambda)$; a light emission spectrum of black-body radiation having a same color temperature as that of the white light source is $B(\lambda)$; a spectrum of a spectral luminous efficiency is $V(\lambda)$; a wavelength at which $P(\lambda) \times V(\lambda)$ becomes largest is $\lambda max1$; and a wavelength at which $B(\lambda) \times V(\lambda)$ becomes largest is $\lambda max2$, and wherein a mass ratio of the phosphor included in the phosphor layer is 60 mass % or more and 90 mass % or less.

3. The white light source according to claim 1, satisfying $-0.1 \leq [(P(\lambda) \times V(\lambda))/(P(\lambda max1) \times V(\lambda max1)) - (B(\lambda) \times V(\lambda))/(B(\lambda max2) \times V(\lambda max2))] \leq +0.1$.

4. The white light source according to claim 1, wherein the color temperature of the white light source is 2,500 K to 7,000 K.

5. The white light source according to claim 2, wherein the phosphor layer comprises four or more types of phosphors having different peak wavelengths.

6. The white light source according to claim 5, wherein the four or more types of phosphor each having different peak wavelengths are used in a combination so as to cause a mutual absorption in which one phosphor is excited by absorbing a light emitted from another phosphor.

7. The white light source according to claim 1, wherein the phosphor layer has a thickness of 0.1 mm or more and 3 mm or less.

8. The white light source according to claim 1, wherein the phosphor contained in the phosphor layer has an average particle diameter of 1 μm or more and 100 μm or less.

9. The white light source according to claim 1, wherein a space is formed to a portion between the phosphor layer and the light emitting diode.

10. The white light source according to claim 1, wherein the phosphor layer is provided on the light emitting diode.

11. The white light source according to claim 1, wherein the phosphor layer is provided on the light emitting diode through a transparent resin layer.

12. A white light source system comprising a plurality of the white light sources according to claim 1.

* * * * *